(12) United States Patent
Fujito et al.

(10) Patent No.: US 10,102,913 B2
(45) Date of Patent: Oct. 16, 2018

(54) SEMICONDUCTOR DEVICE AND CONTROL METHOD OF THE SEMICONDUCTOR DEVICE

(71) Applicant: Renesas Electronics Corporation, Tokyo (JP)

(72) Inventors: Masamichi Fujito, Tokyo (JP); Hiroshi Yoshida, Tokyo (JP); Takanori Takahashi, Tokyo (JP); Yasuhiko Taito, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/667,487

(22) Filed: Aug. 2, 2017

(65) Prior Publication Data

US 2017/0330630 A1  Nov. 16, 2017

(30) Foreign Application Priority Data

Aug. 10, 2015 (JP) ................. 2015-158251

(51) Int. Cl.
  *G11C 16/20* (2006.01)
  *G11C 16/34* (2006.01)
  *G11C 16/32* (2006.01)
  *G11C 16/30* (2006.01)

(52) U.S. Cl.
  CPC .......... *G11C 16/20* (2013.01); *G11C 16/30* (2013.01); *G11C 16/32* (2013.01); *G11C 16/3459* (2013.01)

(58) Field of Classification Search
  CPC ..................................... G11C 16/20
  See application file for complete search history.

(56) References Cited

U.S. PATENT DOCUMENTS

| 9,747,990 B2 * | 8/2017 | Fujito ............... G11C 16/20 |
| 2008/0089146 A1 | 4/2008 | Fujito et al. |
| 2009/0254696 A1 | 10/2009 | Kasai et al. |
| 2010/0232243 A1 * | 9/2010 | Kobatake ............ G11C 7/062 365/207 |
| 2011/0208904 A1 | 8/2011 | Fujito et al. |

FOREIGN PATENT DOCUMENTS

JP  2008-117510 A  5/2008

OTHER PUBLICATIONS

United States Non-Final Office Action dated Mar. 8, 2017 in U.S. Appl. No. 15/167,596.
United States Notice of Allowance dated Apr. 27, 2017 in U.S. Appl. No. 15/167,596.

* cited by examiner

*Primary Examiner* — Hoai V Ho
*Assistant Examiner* — Jay Radke
(74) *Attorney, Agent, or Firm* — McGinn I.P. Law Group, PPLC.

(57) ABSTRACT

A controlling method of a semiconductor device provided with a memory array including a plurality of complementary cells, each cell including a first memory element and a second memory element, for holding binary data depending on a difference of threshold voltage therebetween, the controlling method comprising: performing a prewrite procedure that writes '0' or '1' to both of the first memory element and the second memory element.

20 Claims, 21 Drawing Sheets

FIG. 4A
SPLIT-GATE TYPE FLASH MEMORY ELEMENT AND EXAMPLES OF REWRITE BIASES
(ERASE BY HOT-HALL INJECTION)

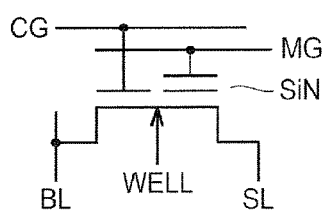

| | BL | CG | MG | SL | WELL | |
|---|---|---|---|---|---|---|
| READ | 1.5 V | 1.5 V | 0 V | 0 V | 0 V | |
| INCREASE Vth | 0 V | 1.5 V | 10 V | 6 V | 0 V | (IN BIT) |
| REDUCE Vth | Hi-Z | 1.5 V | -10 V | 6 V | 0 V | (IN ONE STEP) |

FIG. 4B
SPLIT-GATE TYPE FLASH MEMORY ELEMENT AND EXAMPLES OF REWRITE BIASES
(ERASE BY FN TUNNEL)

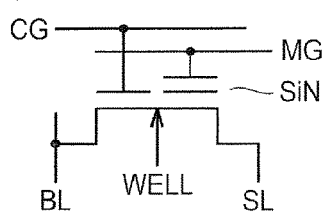

| | BL | CG | MG | SL | WELL | |
|---|---|---|---|---|---|---|
| READ | 1.5 V | 1.5 V | 0 V | 0 V | 0 V | |
| INCREASE Vth | 0 V | 1.5 V | 10 V | 6 V | 0 V | (IN BIT) |
| REDUCE Vth | Hi-Z | 1.5 V | 14 V | 0 V | 0 V | (IN ONE STEP) |

FIG. 4C
STACKED-GATE TYPE FLASH MEMORY ELEMENT (WRITE BY HOT CARRIER)
AND EXAMPLES OF REWRITE BIASES

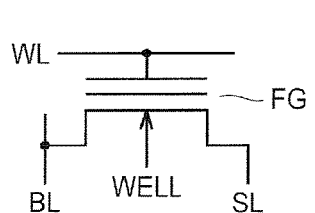

| | BL | WL | SL | WELL | |
|---|---|---|---|---|---|
| READ | 1.5 V | 1.5 V | 0 V | 0 V | |
| INCREASE Vth | 6 V | 10 V | 0 V | 0 V | (IN BIT) |
| REDUCE Vth | 10 V | -10 V | 10 V | 10 V | (IN ONE STEP) |

FIG. 4D
STACKED-GATE TYPE FLASH MEMORY ELEMENT (WRITE BY FN TUNNEL)
AND EXAMPLES OF REWRITE BIASES

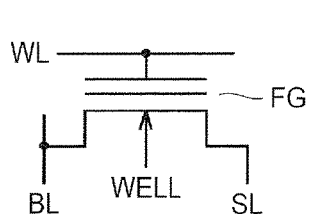

| | BL | WL | SL | WELL | |
|---|---|---|---|---|---|
| READ | 1.5 V | 1.5 V | 0 V | 0 V | |
| INCREASE Vth | -10 V | 10 V | -10 V | -10 V | (IN ONE STEP) |
| REDUCE Vth | 10 V | -10 V | 0 V | 0 V | (IN BIT) |

RELATED ART

RELATED ART

SEMICONDUCTOR DEVICE AND CONTROL METHOD OF THE SEMICONDUCTOR DEVICE

CROSS-REFERENCE TO RELATED APPLICATIONS

The present application is a Continuation Application of U.S. patent application Ser. No. 15/167,596, filed on May 27, 2016, which is based on Japanese Patent Application No. 2015-158251 filed on Aug. 10, 2015 including the specification, drawings and abstract is incorporated herein by reference in its entirety.

BACKGROUND

This disclosure relates to a semiconductor device and more particularly, to a semiconductor device of initializing data stored in a complementary cell typed non-volatile semiconductor memory.

For example, Japanese Unexamined Patent Application Publication No. 2008-117510 relates to a semiconductor memory and discloses a non-volatile semiconductor memory of a pair type of memory cells (complementary cell). A control circuit of the semiconductor memory writes the complementary data respectively in the both memory cells forming the complementary cell. A differential sense amplifier amplifies a potential difference read from the both memory cells and reads the data stored in the complementary cell. The control circuit initializes the data stored in the complementary cell. The threshold voltages of the both initialized memory cells are substantially equal. In such a conventional device, the differential sense amplifier cannot determine which threshold voltage is higher in the memory cells, due to the initialization of the data; as the result, the data of the complementary cell gets unsteady.

SUMMARY

However, when actually performing a control for reducing the threshold voltage of the both memory cells from a state with data written in the complementary cell (where the threshold voltage of one of the memory cells is high), there is a possibility that a little difference between the threshold voltages of the two memory cells remains after initialization. When there remains a little difference of the threshold voltage between the both memory cells, there is a problem that the data of the complementary cell before the initialization can be read out by amplifying the difference by the differential sense amplifier.

This disclosure is made in order to solve the above mentioned problem and an object of the invention in some aspect is to provide a semiconductor device which performs initialization of a complementary cell completely in a simple structure. Further, another object is to provide a control method of a semiconductor device which performs initialization of a complementary cell completely in a simple structure.

Other objects and novel characteristics will be apparent from the description of the specification and the attached drawings.

A semiconductor device according to the embodiments includes a memory array having a plurality of complementary cells, each including a first memory element and a second meangy element, for holding binary data depending on a difference of threshold voltage therebetween, and a control circuit for initializing the complementary cells. The control circuit performs a first initialization control of reducing the threshold voltage of both the first memory element and the second memory element of the complementary cell and changing the threshold voltage of at least one of the first memory element and the second memory element to an intermediate level that is lower than a first writing level and higher than an initialization level, a first writing control of changing the threshold voltage of one of the first memory element and the second memory element of the complementary cell to be at the first writing level, and a second initialization control of changing the threshold voltage of both the first memory element and the second memory element of the complementary cell to the initialization level.

The semiconductor device according to one embodiment can assuredly perform the initialization of the complementary cells in a simple structure.

BRIEF DESCRIPTION OF THE DRAWINGS

FIGS. 4A to 4D are views each showing a structure of a memory cell and an operation voltage condition.

DETAILED DESCRIPTION

Figure 1:
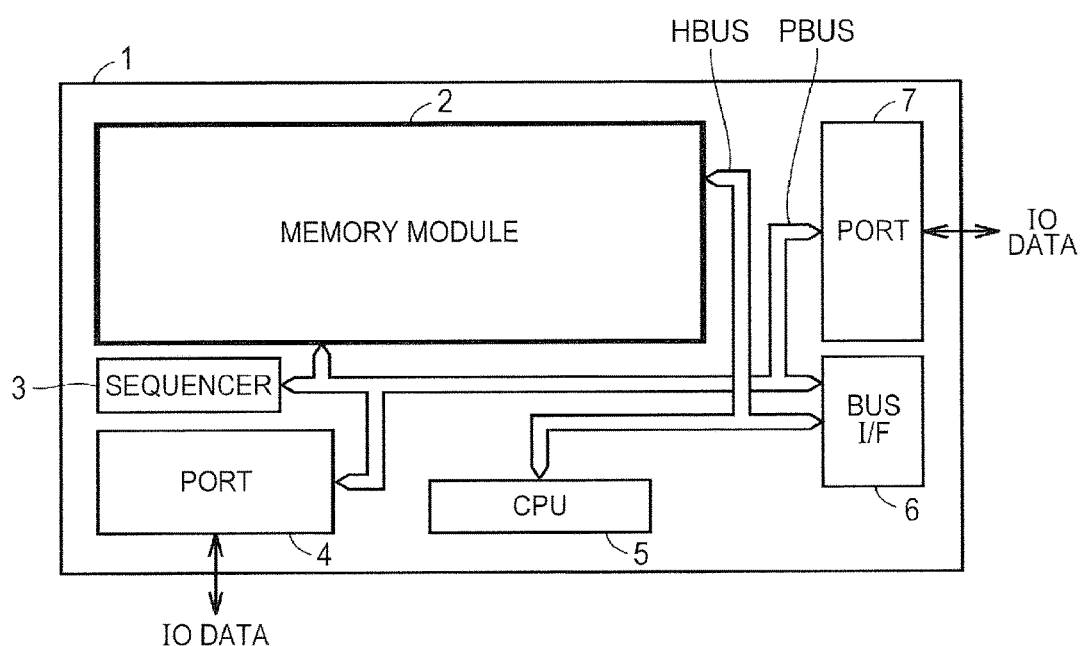
FIG. 1 is a view showing a micro-computer 1 according to a first embodiment.

Hereinafter, embodiments of the invention will be described in detail with reference to the drawings. The same reference numbers are attached to the same or corresponding components in the drawings and their description is not repeated.

FIG. 1 is a view showing a micro-computer 1 according to a first embodiment.

With reference to FIG. 1, the micro-computer 1 includes a high speed bus HBUS and a peripheral bus PBUS. Each of the high speed bus HBUS and the peripheral bus PBUS includes a data bus, an address bus, and a control bus although it is not particularly restricted to the above. The bus is separated into two bus structure, hence to reduce a load imposed on each bus and to realize a high speed access operation.

A Central Processing Unit (CPU) 5, a bus interface 6, and a memory module 2 are coupled to the high speed bus HBUS. The bus interface 6 performs a bus interface control or a bus bridge control on the high speed bus HBUS and the peripheral bus PBUS. The memory module 2 stores data and a program.

A sequencer 3 and ports 4 and 7 for external input and output are coupled to the peripheral bus PBUS. The sequencer 3 gives an instruction to the memory module 2.

The CPU 5 gains access to the memory module 2 through the high speed bus HBUS. When instructing the memory module 2 to do writing and initialization, the CPU 5 gives an instruction to the sequencer 3 via the bus interface 6 through the peripheral bus PBUS. The sequencer 3 performs the initialization control or the writing control on the memory module 2 through the peripheral bus PBUS, based on the instruction from the CPU 5.

Figure 2:
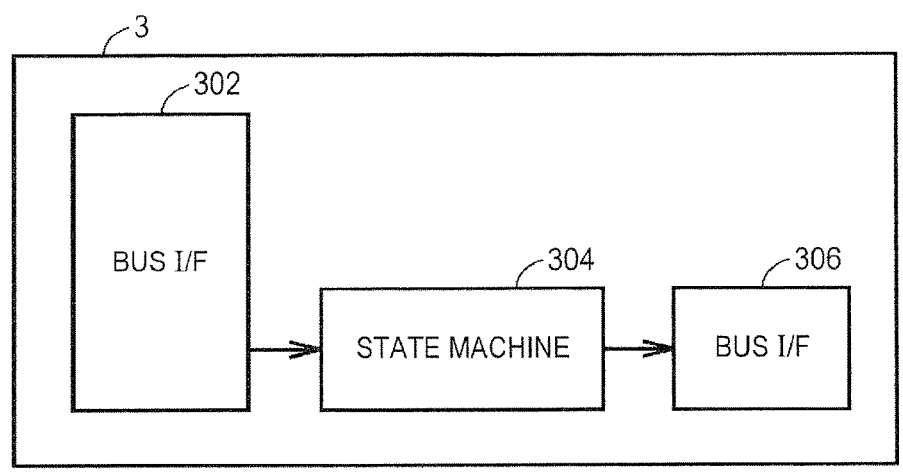
FIG. 2 is a block diagram showing a sequencer according to the first embodiment.

FIG. 2 is a block diagram showing a sequencer according to the first embodiment.

With reference to FIG. 2, the sequencer 3 includes bus interfaces 302 and 306, and a state machine 304.

The bus interface 302 receives the instruction from the CPU 5 through the peripheral bus PBUS. The state machine issues a control command to the memory module 2 according to the instruction input from the bus interface 302. The bus interface 306 outputs the control command from the state machine to the memory module 2.

In another aspect, the sequencer 3 may be built in the memory module 2.

Figure 3:
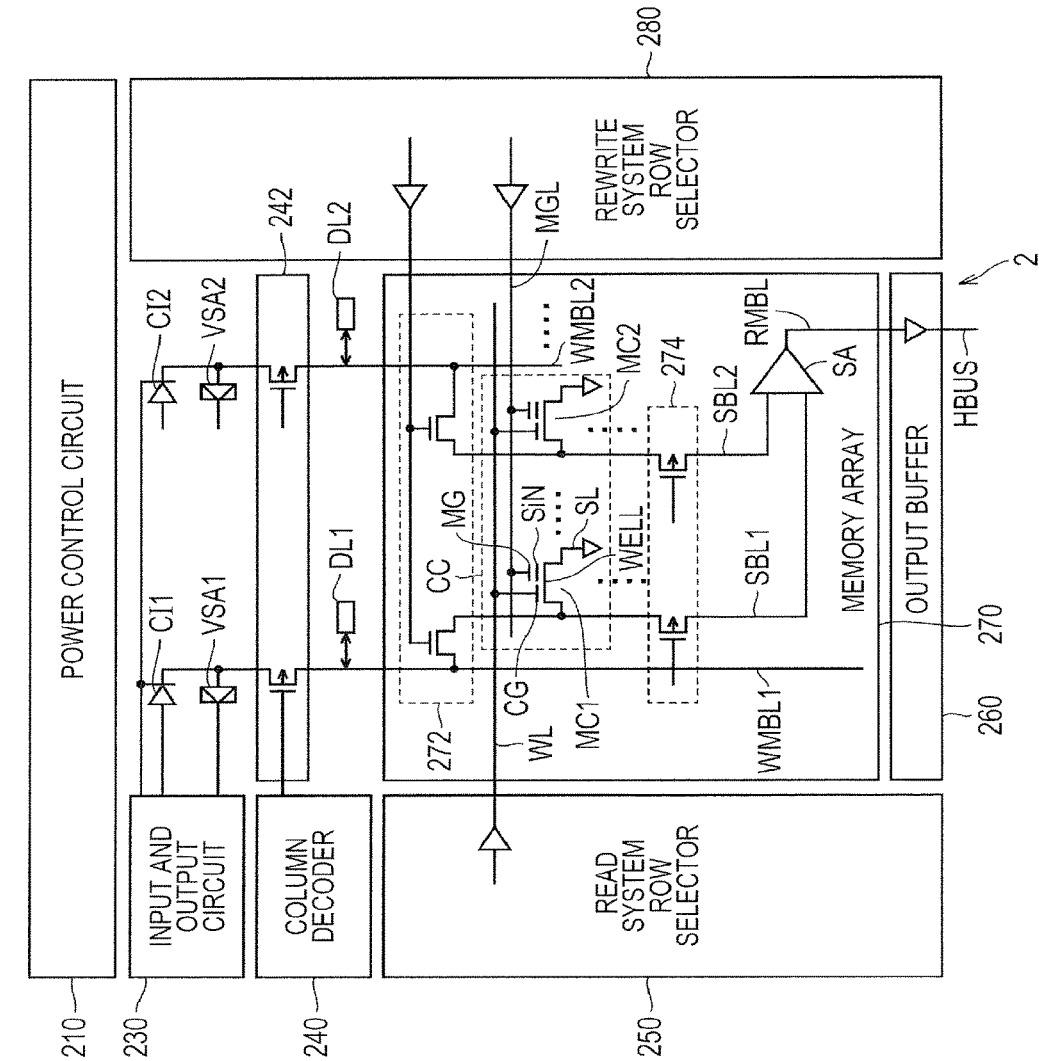
FIG. 3 is a view showing a structure of a memory module 2 according to the first embodiment.

FIG. 3 is a view showing the structure of the memory module 2 according to the first embodiment.

With reference to FIG. 3, the memory module 2 stores 1 bit of information, using two non-volatile memory cells. Specifically, the memory cell array 270 includes two respectively rewritable non-volatile memory cells MC1 and MC2 as a complementary cell CC for 1 bit.

By way of example, the memory cells MC1 and MC2 are assumed to be a split-gate type flash memory cell as shown in FIG. 4A described later.

A select line MGL of a common memory gate is coupled to the memory gates MG1 and MG2 of the memory cells MC1 and MC2. A common word line WL is coupled to the control gates CG1 and CG2 of the memory cells MC1 and MC2. Actually, many complementary cells CC are arranged in a matrix shape. Each of the complementary cells CC is coupled to the corresponding select line MGL and word line WL in every array unit in a row direction. The memory cells MC1 and MC2 are coupled to sub bit lines SBL1 and SBL2 respectively in every column unit. The memory cells MC1 and MC2 are coupled to writing main bit lines WMBL1 and WMBL2 respectively through the selector 272 for the sub bit lines.

A plurality of sub bit lines SBL1 and SBL2 are respectively coupled to the main bit lines hierarchically by the selector 272. The unit hierarchized into the sub bit line is referred to as a memory mat. The sub bit line SBL1 of the memory cell MC1 is coupled to one differential input terminal of the differential sense amplifier SA through a reading column selector 274 in every memory mat. On the other hand, the sub bit line SBL2 of the memory cell MC2 is coupled to the other differential input terminal of the differential sense amplifier SA through the reading column selector 274 in every memory mat.

The word line WL is selected by a read system row selector 250. The select line MGL and the selector 272 are selected by a rewrite system row selector 280. The output of the differential sense amplifier SA is coupled to the reading main bit line RMBL and coupled to the high speed bus HBUS via an output buffer 260.

A write current is selectively poured in the main bit lines WMBL1 and WMBL2 via the clocked inverters CI1 and CI2 according to the latch data of the writing data latch circuits DL1 and DL2.

The data latch circuits DL1 and DL2 are selected by a rewrite system column selector 242. The main bit lines WMBL1 and WMBL2 selected by the column selector 242 are respectively coupled to verify circuits VSA1 and VSA2 for performing verification. The verify circuits VSA1 and VSA2 compare the data of the memory cells MC1 and MC2 specified by address with the data held by the corresponding data latch circuits DL1 and DL2. The verify circuits VSA1 and VSA2 output the comparison result to an input and output circuit 230. The input and output circuit 230 is coupled to the peripheral bus PBUS. The comparison result of the verify circuits VSA1 and VSA2 is output to the sequencer 3 through the peripheral bus PBUS.

The column selector 242 is selected by a column decoder 240. A power control circuit 210 generates various types of operation powers necessary for data reading, writing, and initialization.

FIGS. 4A to 4D are views each showing a structure of a memory cell and an operation voltage condition.

With reference to FIGS. 4A to 4D, a plurality of types of memory cells are shown.

FIG. 4A shows a split-gate type flash memory cell.

In the embodiment, the memory cells MC1 and MC2 forming the memory module 2 are described using the split-gate type flash memory cell; however, another memory cell may be used.

With reference to FIG. 4A, the memory cell includes a control gate CG and a memory gate MG arranged over the channel forming area between source and drain regions with a gate insulation film interposed therebetween. A charge trap region SiN of e.g. silicon nitride is arranged between the memory gate MG and the gate insulation film.

The source or drain region at the side of the control gate CG is coupled to a bit line BL. The source or drain region at the side of the memory gate MG is coupled to a source line SL. The processing of reducing the threshold voltage Vth of the memory cell is performed under the condition of BL=Hi-Z (high impedance state), CG=1.5 V, MG=−10 V, SL=6 V, and WELL=0 V. Specifically, a high electric field between the well region WELL and the memory gate MG draws electrons from the charge trap area SiN into the well region WELL. The processing of reducing the threshold voltage Vth of the memory cell is performed by the unit of a plurality of memory cells sharing the memory gate MG.

The processing of increasing the threshold voltage Vth of the memory cell is performed under the condition of BL=0 V, CG=1.5 V, MG=10 V, SL=6 V, and WELL=0 V. Specifically, a write current is made to flow from the source line SL to the bit line BL, and hot electrons generated in a portion of the boundary between the control gate and the memory gate are injected into the charge trap area SiN. Whether or not to inject the electrons into the charge trap area SiN depends on whether or not to pass an electric current to the bit line BL; therefore, the processing of increasing the threshold voltage Vth of the memory cell is performed by the unit of bit.

The processing of reading data from the memory cell is performed under the condition of BL=1.5 V, CG=1.5 V, MG=0 V, SL=0 V, and WELL=0 V. When the threshold voltage Vth of the memory cell is lower, the memory cell is turned to ON state. When the threshold voltage Vth of the memory cell is higher, the memory cell is turned to OFF state.

In another aspect, in FIG. 4B, the split-gate typed memory cell is shown. A high voltage may be applied to the memory gate MG to release the electrons to the bit line BL by FN tunnel effect, hence to reduce the threshold voltage Vth. A control of increasing the threshold voltage Vth is the same as in FIG. 4A; therefore, its description is not repeated.

In another aspect, FIGS. 4C and 4D show a stacked-gate flash memory cell. This memory cell is formed by stacking a floating gate FG and a control gate WL over the channel forming area between the source and drain regions with the gate insulation film interposed therebetween. As shown in FIG. 4C, the threshold voltage Vth of the memory cell is increased by a hot carrier writing method and reduced by releasing the electrons to the well region WELL. On the other hand, as shown in FIG. 4D, the threshold voltage of the memory cell is increased by the FN tunnel writing method and reduced by releasing the electrons to the bit line BL.

Here, each voltage value shown in FIGS. 4A to 4D indicates only a magnitude relation relative to another voltage and it is not restricted to this.

Figure 5:
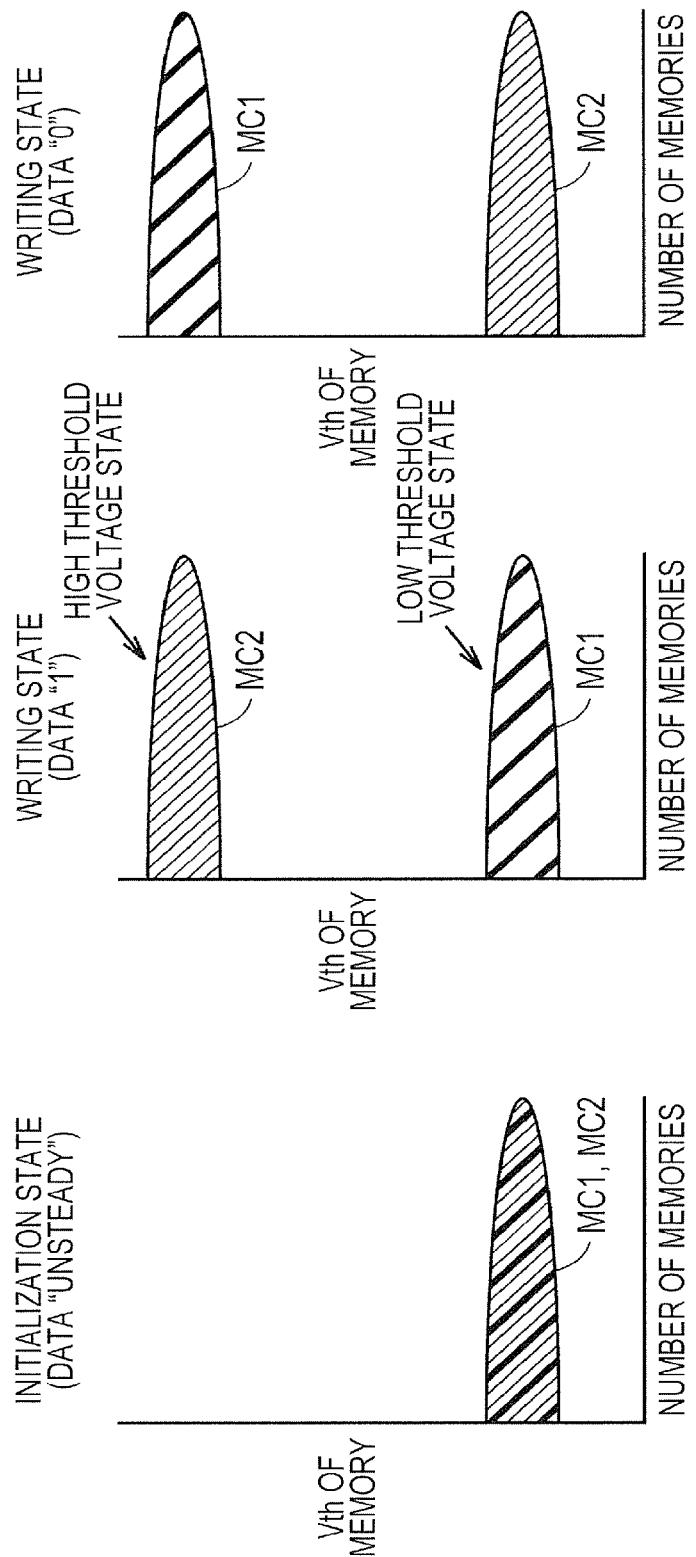
FIG. 5 is a view showing a distribution of threshold voltage in a complementary cell.

FIG. 5 is a view showing the distribution of a threshold voltage in a complementary cell.

With reference to FIG. 5, the respective memory cells MC1 and MC2 can keep in a low threshold voltage state or a high threshold voltage state. Information storage by one complementary cell CC including the memory cells MC1 and MC2 is realized by storing complementary data in the memory cells MC1 and MC2. Specifically, one memory cell MC1 of the complementary cell CC is assumed to be a positive electrode cell and the other memory cell MC2 is assumed to be a negative electrode cell.

In the example, data "1" of the complementary cell CC means that the threshold voltage Vth of the negative electrode cell MC2 is higher than the threshold voltage Vth of the positive electrode cell MC1.

In the example, data "0" of the complementary cell CC means that the threshold voltage Vth of the positive electrode cell MC1 is higher than the threshold voltage Vth of the negative electrode cell MC2. Here, the state of the data "1" and "0" of the complementary cell CC may be conversely correlated with a relation of the threshold voltage between the positive electrode cell MC1 and the negative electrode cell MC2.

In the example, the state in which both the positive electrode cell MC1 and the negative electrode cell MC2 of the complementary cell CC are in a low threshold voltage, is regarded as initialization state. In the initialization state, if there is a little difference in the threshold voltage Vth between both memory cells, the data of the complementary cell CC is said to be unsteady or insecure.

Figure 6:
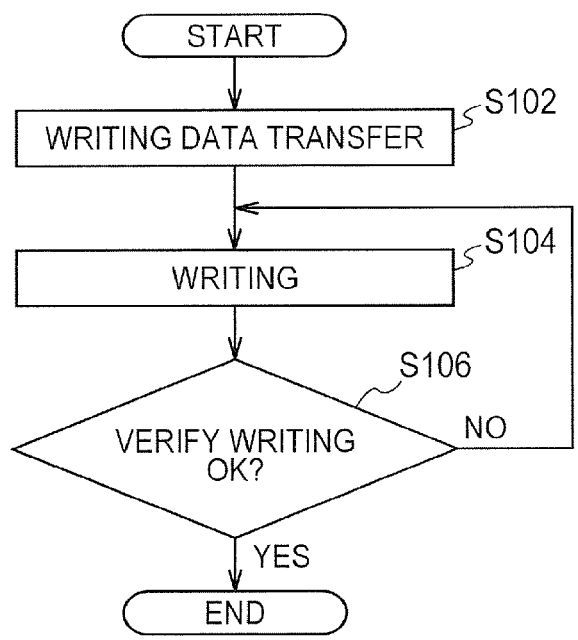
FIG. 6 is a view showing a data writing flow in the complementary cell.

FIG. 6 is a view showing a data writing flow of the complementary cell.

With reference to FIG. 6, in reply to a writing command given from the CPU 5, the sequencer 3 outputs the writing address information of the memory cells MC1 and MC2 and the voltage application condition to the memory module 2 (Step S102).

Next, in reply to the instruction given from the sequencer 3, the memory module 2 changes the threshold voltage of the memory cell specified by address. Specifically, the memory module 2 changes the threshold voltage of one of the memory cells MC1 and MC2 in the initialization state from the low threshold voltage state to the high threshold voltage state (Step S104). In the example, the data to be held depending on the threshold voltage state of each of the memory cells MC1 and MC2 is also referred to as cell data. By way of example, the cell data to be held when the memory cell MC1 or MC2 is in the state of the low threshold voltage is defined as "1" and the cell data to be held when it is in the high threshold voltage is defined as "0".

Then, the sequencer 3 confirms whether or not the memory cells MC1 and MC2 specified by address arrive at a targeted threshold voltage Vth (Step S106). Specifically, verify circuits VSA1 and VSA2 respectively compare the cell data of the memory cells MC1 and MC2 specified by address with the data held by the corresponding data latch circuits DL1 and DL2. Based on the comparison result by the verify circuits VSA1 and VSA2 input through the peripheral bus PBUS, the sequencer 3 finishes a writing control when the both data (the cell data of the memory cell MC1 and the data held by the data latch circuit DL1, as well as the cell data of the memory cell MC2 and the data held by the data latch circuit DL2) is in one accord. On the other hand, the sequencer 3 outputs a command for performing the writing control to the memory module 2 again when the both data is not in one accord.

Figure 7:
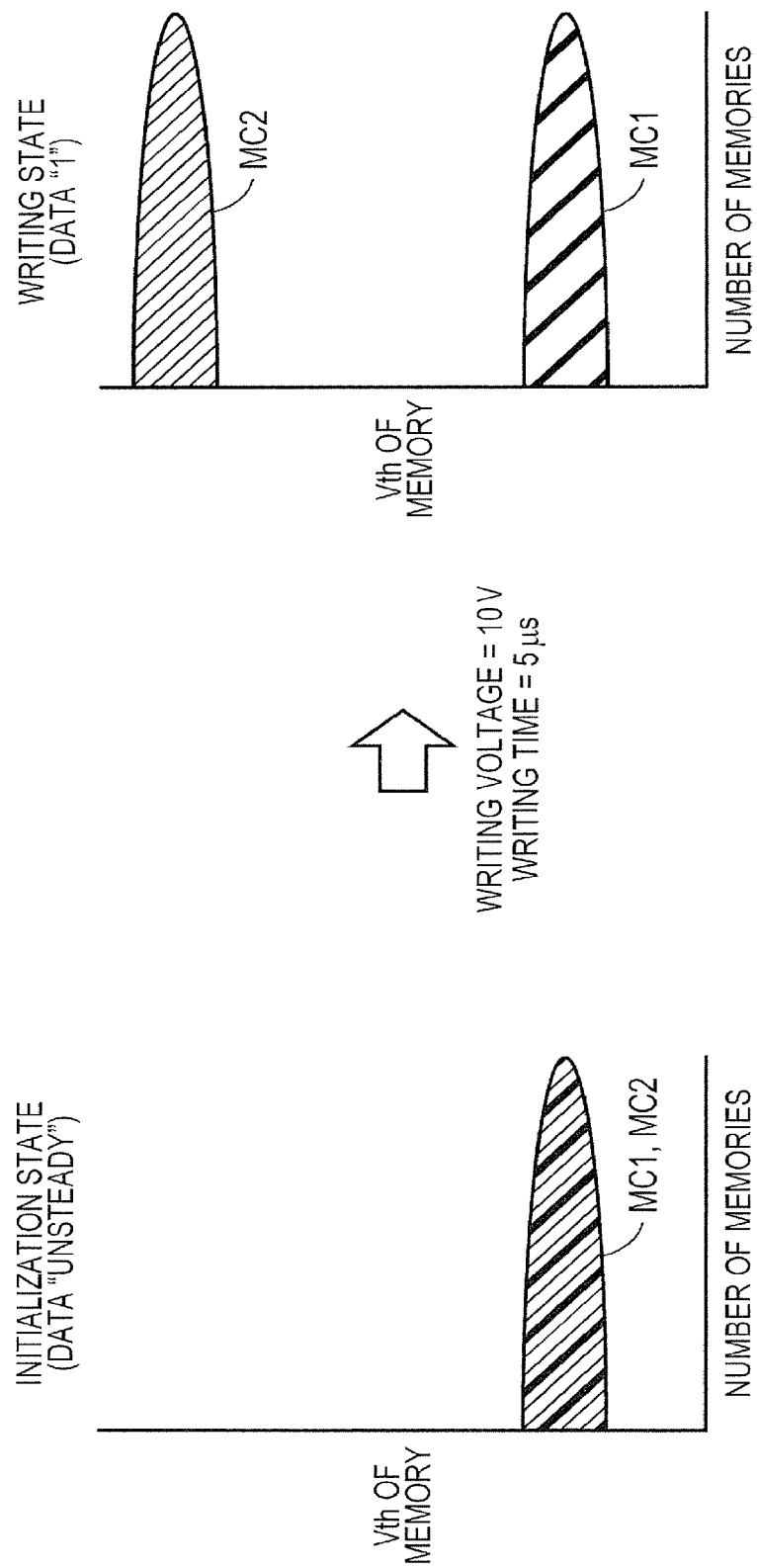
FIG. 7 is a view showing data writing to the complementary cell.

FIG. 7 is a view showing data writing to a complementary cell.

With reference to FIG. 7, here, in the writing operation (Step S104) of FIG. 6, an example of writing the data "1" in the complementary cell CC is shown.

The voltage of BL=0 V, CG=1.5 V, MG=10 V, SL=6 V, and WELL=0 V is applied to the negative electrode cell MC2, of the memory cells MC1 and MC2 in the initialization state for 5 μs, hence to make the threshold voltage Vth of the negative electrode cell MC2 from the low threshold voltage state to the high threshold voltage state. The threshold voltage Vth of the negative electrode cell MC2 gets higher than the threshold voltage Vth of the positive electrode cell MC1.

Accordingly, the data "1" is written in the complementary cell CC.

Hereinafter, a voltage applied to the memory gate MG is also referred to as a gate voltage.

[Conventional Initialization Method of Complementary Cell]

Figure 8:
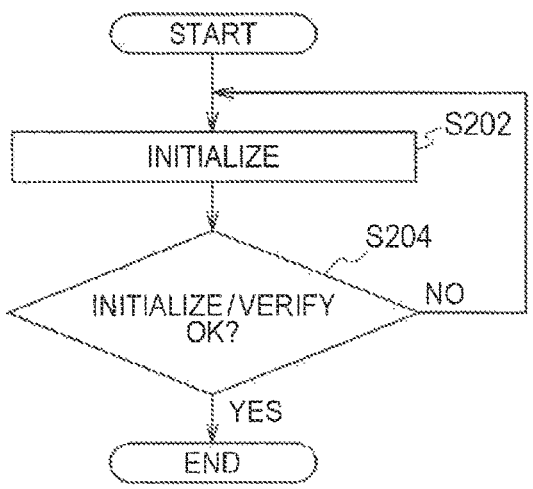
FIG. 8 is a view showing a data initialization flow of a complementary cell in the conventional way.

FIG. 8 is a view showing a data initialization flow of a complementary cell in the conventional way.

With reference to FIG. 8, in reply to the initialization instruction given from the sequencer 3, the memory module 2 makes the threshold voltage Vth of the memory cells MC1 and MC2 specified by address in the low threshold voltage state (Step S202).

Next, the sequencer 3 confirms whether or not the memory cells MC1 and MC2 specified arrive at the targeted threshold voltage Vth (Step S204).

Specifically, similarly to the writing verify operation, the verify circuits VSA1 and VSA2 respectively compare the cell data of the memory cells MC1 and MC2 specified by address with the data held by the corresponding data latch circuits DL1 and DL2.

The sequencer 3 finishes the initialization control when determining that the both data is in one accord, based on the comparison result of the verify circuits VSA1 and VSA2. On the other hand, when determining that the both data is not in one accord, the sequencer 3 outputs the command for performing the initialization control to the memory module 2 again.

However, in the conventional initialization method of the complementary cell as mentioned above, there is a possibility that a difference of the threshold voltage Vth between the both memory cells before the initialization control may affect the operation even after the initialization control and there is the case of not completely cancelling the difference of the threshold voltage Vth between the both memory cells.

Figure 9:
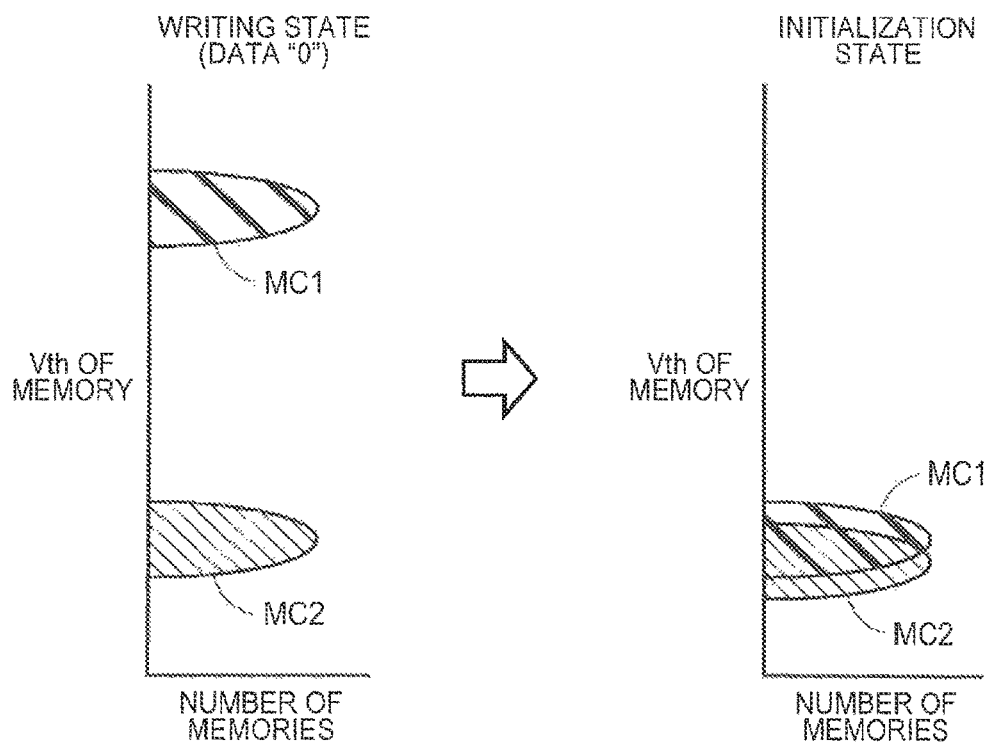
FIG. 9 is a view showing a transition of a threshold voltage distribution in the complementary cell (data "0") in the conventional initialization method.

FIG. 9 is a view showing a transition of the threshold voltage distribution of the complementary cell (data "0") according to the conventional initialization method.

FIG. 9 shows the case of performing an initialization control on the state of the complementary cell data "0" when the positive electrode cell MC1 is in the high threshold voltage state and the negative electrode cell MC2 is in the low threshold voltage state.

As the result of performing the initialization control, the both memory cells get into the low threshold voltage state. However, affected by a difference of the threshold voltage Vth between the both memory cells before the initialization control, the threshold voltage Vth of the positive electrode cell MC1 is a little higher than the threshold voltage Vth of the negative electrode cell MC2; hence, the state of the complementary cell is unsteady or insecure.

Figure 10:
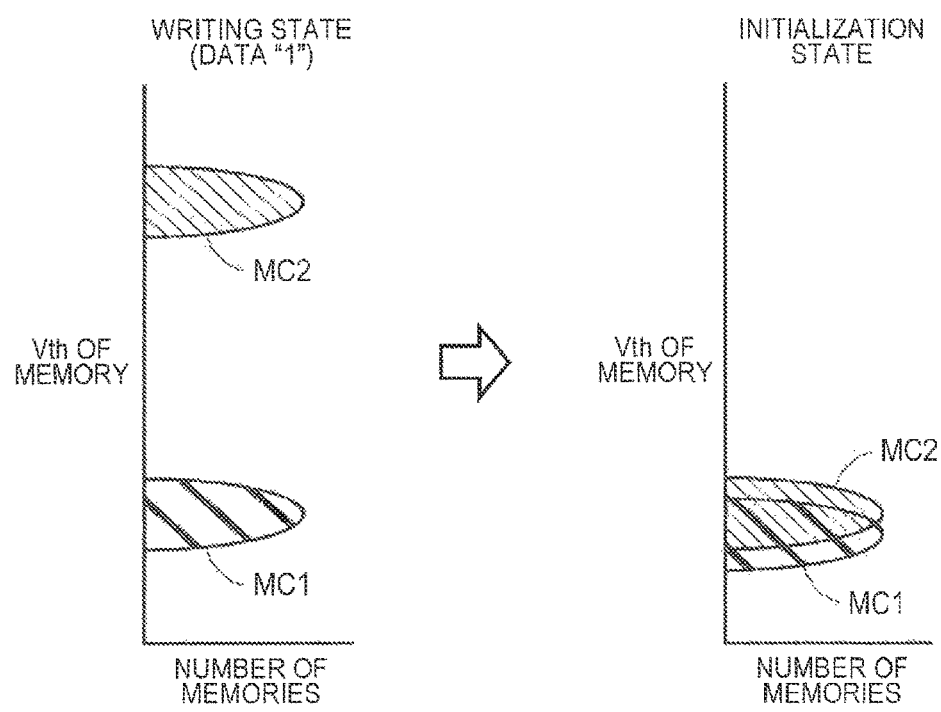
FIG. 10 is a view showing a transition of the threshold voltage distribution in the complementary cell (data "1") in the conventional initialization method.

FIG. 10 is a view showing a transition of the threshold voltage distribution of the complementary cell (data "1") according to the conventional initialization method.

FIG. 10 shows the case of performing the initialization control on the state of the complementary cell CC data "1" when the negative electrode cell MC2 is in the high threshold voltage state and the positive electrode cell MC1 is in the low threshold voltage state.

As the result of performing the initialization control, both memory cells get in the low threshold voltage state. However, affected by a difference of the threshold voltage Vth between the both memory cells before the initialization control, the threshold voltage Vth of the negative electrode cell MC2 is higher than the threshold voltage Vth of the positive electrode cell MC1.

Accordingly, even in the initialization controlled complementary cell, by amplifying and reading a little difference of the threshold voltage Vth between the both memory cells by the differential sense amplifier SA, in the above case, it is possible to determine whether the data of the complementary cell before the initialization was a "0" or "1". In the conventional initialization method, security is low and there is a risk of data leakage.

First Embodiment—Initialization of Complementary Cell Using Weak Initialization

Figure 11:
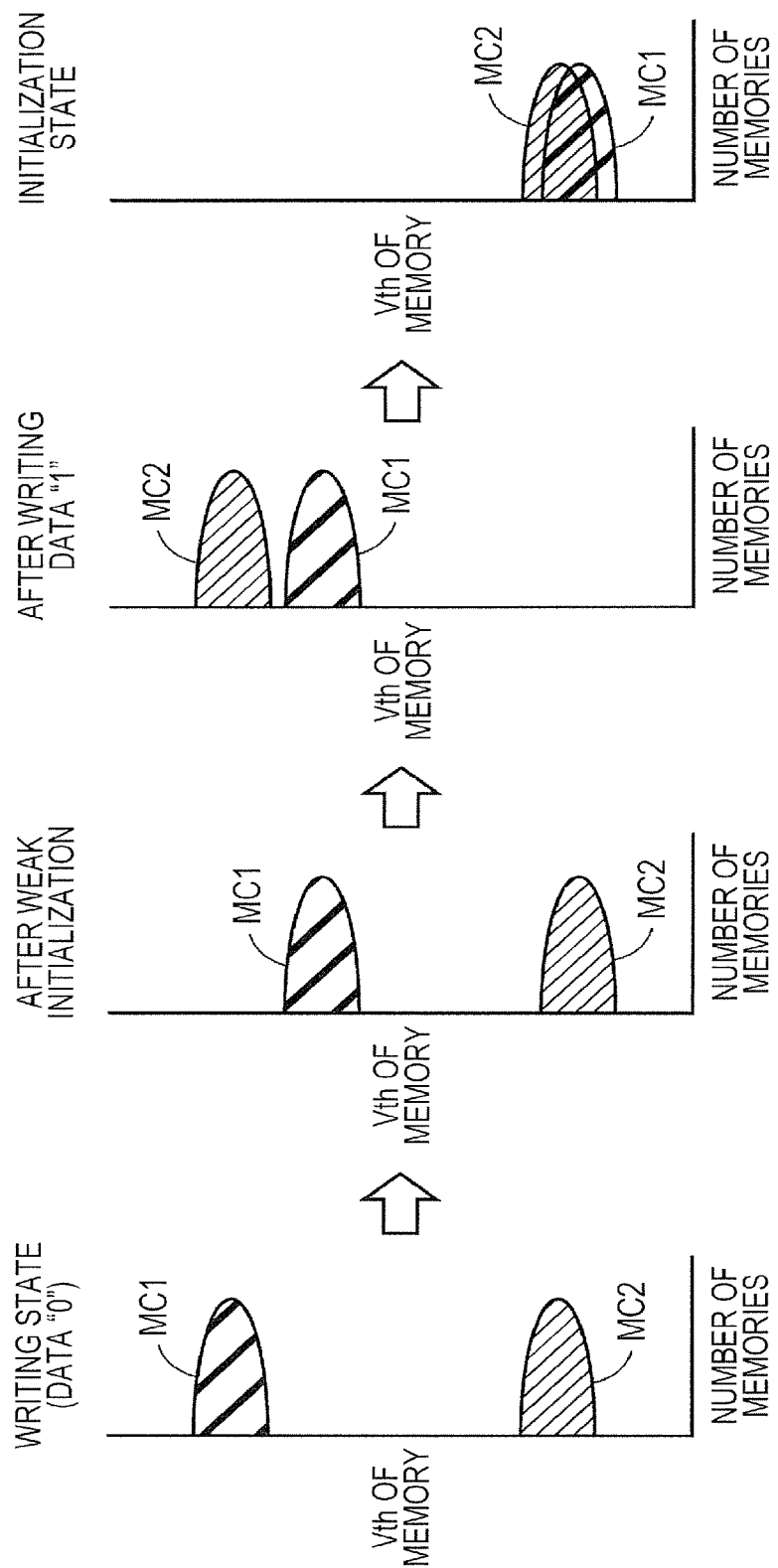
FIG. 11 is a view showing a transition of the threshold voltage distribution in the both memory cells forming the complementary cell (data "0") in the case of initialization by an initialization method according to the first embodiment.

FIG. 11 is a view showing a transition of a threshold voltage distribution in the both memory cells forming the complementary cell (data "0") in the case of initialization by an initialization method according to the first embodiment.

The initialization method according to the first embodiment can initialize the data completely even in the complementary cell.

With reference to FIG. 11, the case of initializing the complementary cell CC of the data "0" will be described.

The sequencer 3 performs a weak initialization control on the complementary cell CC in data state "0" when the positive electrode cell MC1 is in a high threshold voltage state and the negative electrode cell MC2 is in a low threshold voltage state. The weak initialization control indicates a control of reducing the threshold voltage of the both memory cells. Specifically, it means that a threshold voltage of one of the two memory cells of CC is changed to be an intermediate threshold voltage that is higher than the threshold voltage (level) of an initialized controlled memory cell and is lower than either the threshold voltage (level) of the positive electrode cell MC1 in the cell CC having data state "0" before the weak initialization control or the threshold voltage (level) of the negative electrode cell MC2 in the cell CC having data state "1" before the weak initialization control. As the result of performing the weak initialization control, the threshold voltage Vth of the both memory cells is reduced.

Next, the sequencer 3 performs the writing control of the data "1" on the complementary cell CC. As the result of performing the writing control of the data "1", the negative electrode cell MC2 is turned from the low threshold voltage state to the high threshold voltage state. Further, the threshold voltage Vth of the negative electrode cell MC2 becomes higher than the threshold voltage Vth of the positive electrode cell MC1.

The sequencer 3 performs the initialization control. As the result of performing the initialization control, affected by a difference of the threshold voltage Vth between the both memory cells before the initialization control, the threshold voltage Vth of the negative electrode cell MC2 is higher than the threshold voltage Vth of the positive electrode cell MC1.

Next, the case of initializing the complementary cell CC of the data "1" will be described.

Figure 12:
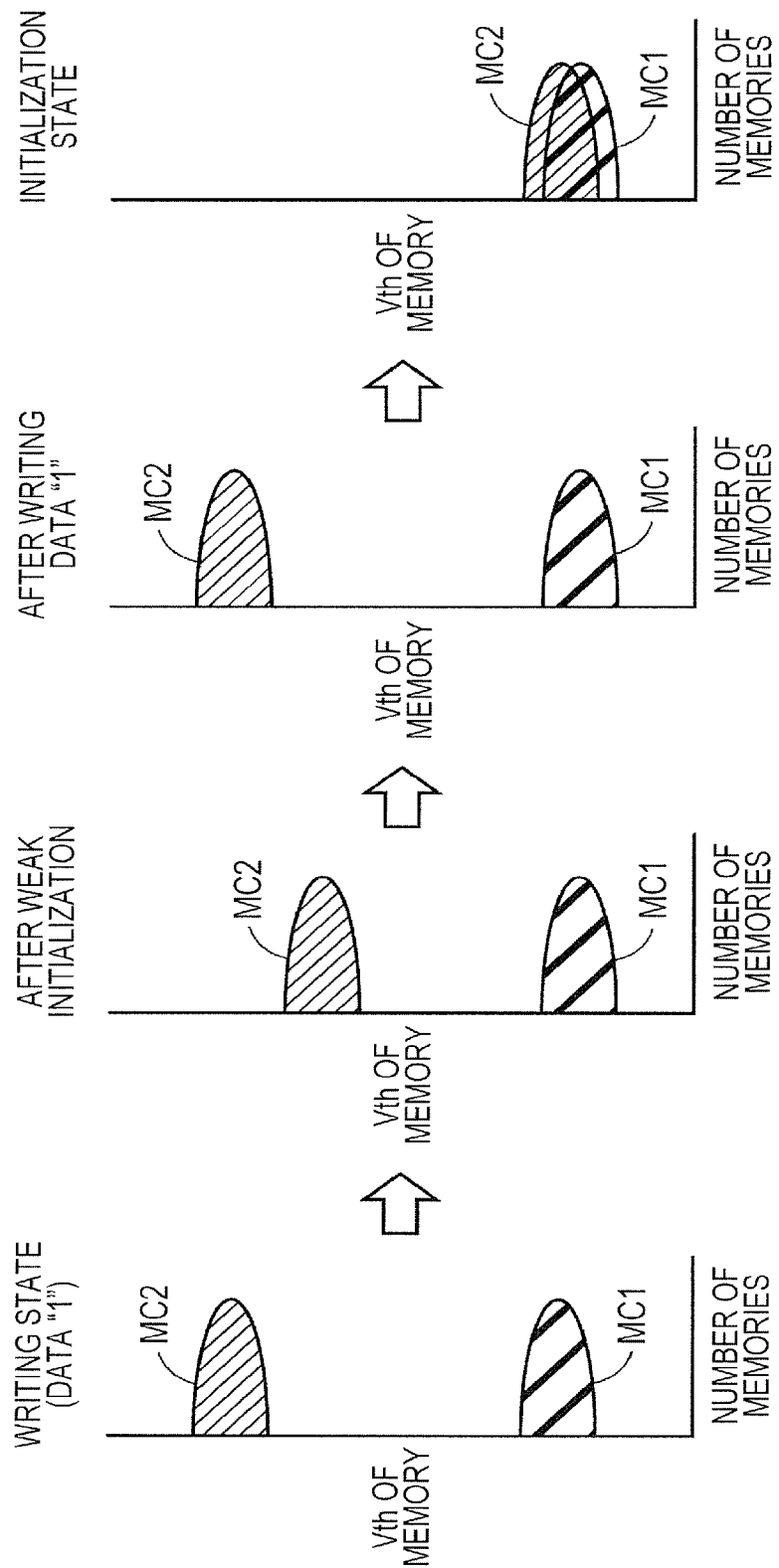
FIG. 12 is a view showing a transition of the threshold voltage distribution in the both memory cells forming the complementary cell in the case of initialization by the initialization method according to the first embodiment.

FIG. 12 is a view showing a transition of a threshold voltage distribution in the both memory cells forming the complementary cell in the case of initialization by the initialization method according to the first embodiment.

With reference to FIG. 12, the sequencer 3 performs the weak initialization control on the state of the complementary cell CC data "1" when the positive electrode cell MC1 is in the low threshold voltage state and the negative electrode cell MC2 is in the high threshold voltage state. As the result of performing the weak initialization control, the threshold voltage Vth of the both memory cells is reduced.

Next, the sequencer 3 performs the writing control of the data "1" on the complementary cell CC. As the result of performing the writing control of the data "1", the threshold voltage Vth of the negative electrode cell MC2 is higher. Next, the sequencer 3 performs the initialization control. As the result of performing the initialization control, affected by a difference of the threshold voltage Vth between the both memory cells before the initialization control, the threshold voltage Vth of the negative electrode cell MC2 is higher than the threshold voltage Vth of the positive electrode cell MC1.

As shown in FIGS. 11 and 12, in the initialization method of the complementary cell according to the first embodiment, the final state of the complementary cell CC becomes one in which the threshold voltage Vth of the negative electrode cell MC2 is a little higher than the threshold voltage Vth of the positive electrode cell MC1, which is as, if the conventional initialization method of FIG. 9 was applied to a complementary cell storing data "1", regardless of the data state before initializing.

Therefore, in the case of performing the initialization method based on the first embodiment, it cannot be determined whether the stored data (the datum) of the complementary cell CC before the initialization was "0" or "1". According to the initialization method of the complementary cell according to the embodiment, it is possible to realize the initialization of the complementary cell with a high level of security.

In another aspect of the first embodiment, after the sequencer 3 performs the weak initialization control, it may be considered that the sequencer 3 performs the writing control of the data "0" not the data "1" on the complementary cell CC.

In FIGS. 11 and 12, when the sequencer 3 performs the writing control of the data "0" on the complementary cell CC after the weak initialization control, the threshold voltage Vth of the positive electrode cell MC1 is in the high threshold voltage state. As the result of performing the writing control of the data "0", the threshold voltage Vth of the positive electrode cell MC1 is higher than the threshold voltage Vth of the negative electrode cell MC2.

Next, when the sequencer 3 performs the initialization control, affected by a difference of the threshold voltage Vth between the both memory cells before the initialization, the threshold voltage Vth of the positive electrode cell MC1 is higher than the threshold voltage Vth of the negative electrode cell MC2.

Accordingly, when the complement cell CC is initialized from any one of the states of data "0" and "1" FIG. 11 and FIG. 12, wherein a data "0" is written instead of a data "1" after performing weak initialization, the state of the complementary cell CC becomes the state in which the threshold voltage Vth of the positive electrode cell MC1 is higher than the threshold voltage Vth of the negative electrode cell MC2, which is as if the conventional initialization method of FIG. 9 was applied to a complementary cell CC storage data "0".

Accordingly, when performing the initialization method based on the first embodiment, it cannot be determined whether the data of the complementary cell CC written before the initialization is "0" or "1".

Figure 13:
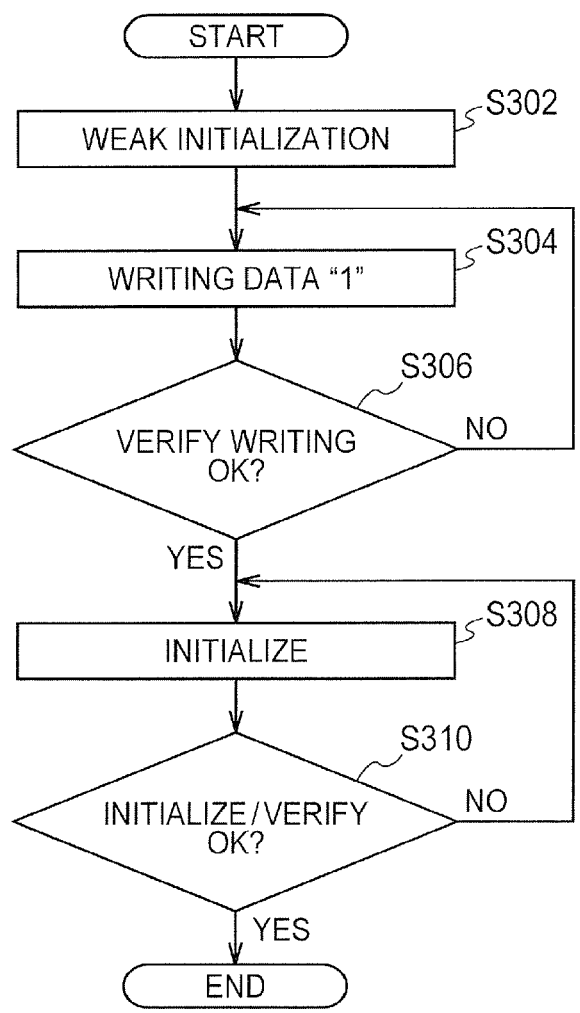
FIG. 13 is a view showing an initialization flow in the complementary cell according to the first embodiment.

FIG. 13 is a view showing an initialization flow of the complementary cell according to the first embodiment.

Figure 14:
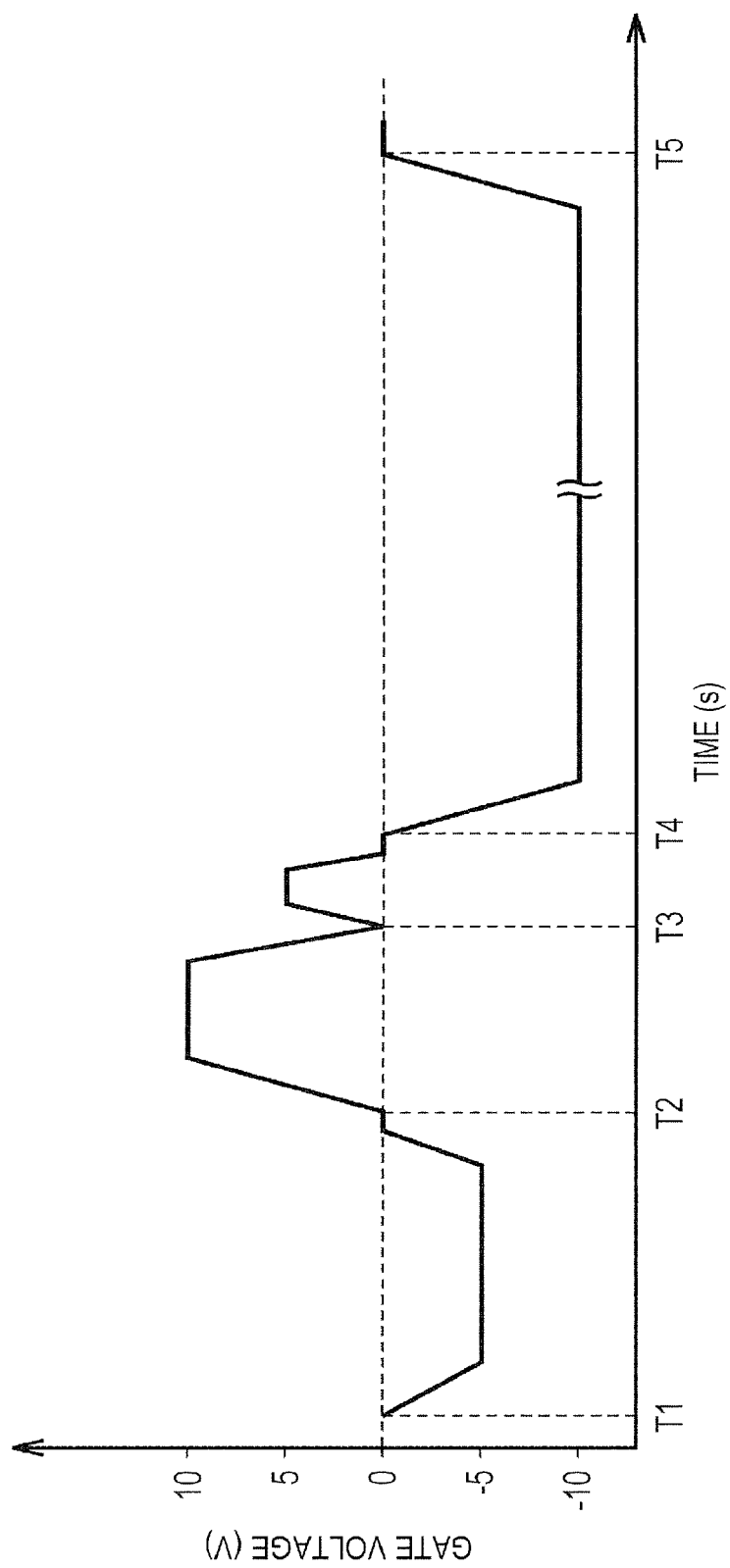
FIG. 14 is a view for use in describing a timing chart of a voltage to be applied to a memory gate corresponding to the initialization flow of FIG. 13.

FIG. 14 is a view for use in describing a timing chart of a voltage to be applied to a memory gate corresponding to the initialization flow of FIG. 13.

With reference to FIG. 13, the sequencer 3 performs the weak initialization control on the memory cells MC1 and MC2 specified by address (Step S302). Specifically, at the time T1 shown in FIG. 14, a power control circuit 210 applies the voltage of BL=Hi-Z (high impedance state), CG=1.5 V, MG=−5 V, SL=6 V, and WELL=0 V to the memory cells MC1 and MC2 specified by address for 5 μs. Actually, there is a delay to a targeted voltage (for example, MG=−5 V) being applied to the memory cells MC1 and MC2; therefore, the time of the targeted voltage being applied to the memory cells MC1 and MC2 is shorter than 5 μs by the time of the delay.

Next, the sequencer 3 performs the writing control of the data "1" on the complementary cell CC (Step S304). Specifically, at the time T2 shown in FIG. 14, the power control circuit 210 applies the voltage of BL=0 V, CG=1.5 V, MG=10 V, SL=6, and WELL=0 V to the negative electrode cell MC2 specified by address for 5 μs. As the result of applying the targeted voltage, the threshold voltage Vth of the negative electrode cell MC2 becomes 5 V.

Then, the sequencer 3 confirms whether or not the specified memory cells MC1 and MC2 arrive at the targeted threshold voltage Vth (Step S306). Specifically, at the time T3 shown in FIG. 14, the power control circuit 210 applies the voltage of BL=1.5 V, CG=1.5 V, MG=5 V, SL=0 V, and WELL=0 V to the memory cells MC1 and MC2 for 1 μs.

The verify circuits VSA1 and VSA2 compare the cell data output from the memory cells MC1 and MC2 specified by address with the data held by the corresponding data latch circuits DL1 and DL2.

Based on the comparison result output from the verify circuits VSA1 and VSA2, when the sequencer 3 determines that the both data is in one accord (YES in Step S306), it proceeds to the next initialization step (Step S308). On the other hand, when the sequencer 3 determines that the both data is not in one accord (NO in Step S306), it outputs the instruction of performing the writing control of the data "1" to the memory module 2.

Next, the sequencer 3 turns the threshold voltage Vth of the memory cells MC1 and MC2 specified by address into the low threshold voltage (Step S308). Specifically, at the time T4 of FIG. 14, the power control circuit 210 applies the voltage of BL=Hi-Z (high impedance state), CG=1.5 V, MG=−10 V, SL=6 V, and WELL=0 V to the memory cells MC1 and MC2 for 50 μs.

Next, the sequencer 3 confirms whether or not the specified memory cells MC1 and MC2 arrive at the targeted low threshold voltage state (Step S310). Specifically, at the time T5 shown in FIG. 14, the power control circuit 210 applies the voltage of BL=1.5 V, CG=1.5 V, MG=0 V, SL=0 V, and WELL=0 V to the memory cells MC1 and MC2 for 1 μs. The verify circuits VSA1 and VSA2 compare the cell data output from the specified memory cells MC1 and MC2 with the data held by the corresponding data latch circuits DL1 and DL2. Based on the result of the comparison result output from the verify circuits VSA1 and VSA2, when the sequencer 3 determines that the both data is in one accord (YES in Step S310), it finishes a series of initialization control. On the other hand, when the sequencer 3 determines that the both data is not in one accord (NO in Step S310), it outputs the instruction of performing the initialization control to the memory module 2 again.

In FIGS. 13 and 14, the voltage value and the application time in each step are only one example and not restricted to these.

The initialization method of a complementary cell according to the first embodiment can initialize the data stored in the complementary cell completely in the structure using the complementary cell as a storing element of a semiconductor device.

Figure 15:
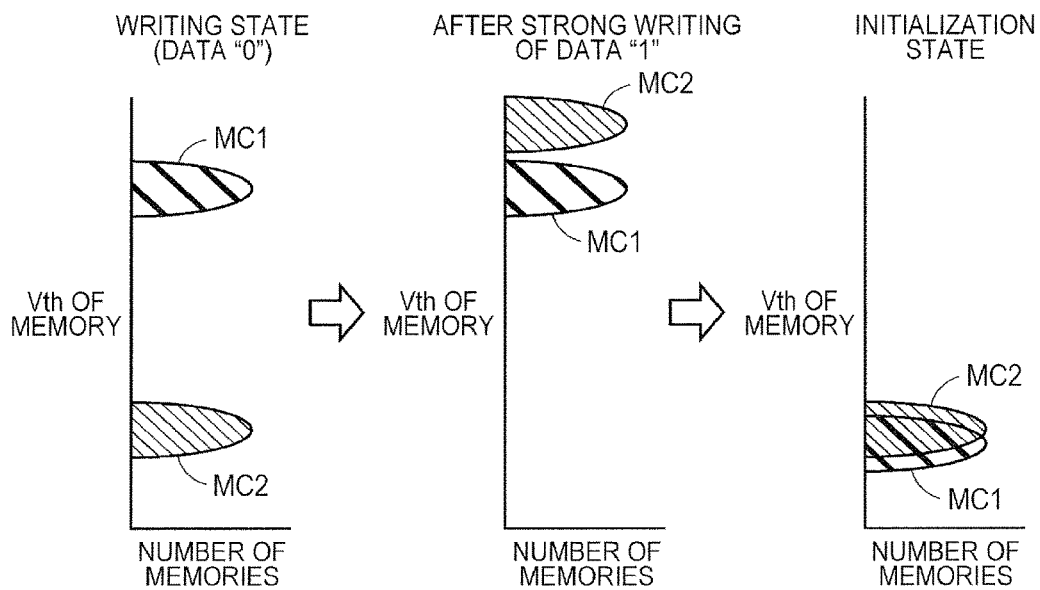
FIG. 15 is a view showing a transition of the threshold voltage distribution in the both memory cells forming the complementary cell (data "0") in the case of initialization by an initialization method according to a second embodiment.

Second Embodiment—Initialization of Complementary Cell Using Strong Data Writing FIG. 15 is a view showing a transition of a threshold voltage distribution in the both memory cells forming the complementary cell (data 0) in the case of initialization by an initialization method according to a second embodiment.

With reference to FIG. 15, the sequencer 3 performs a strong writing control of the data "1" on the complementary cell CC from the state of the complementary cell CC data "0". The strong writing control of the data "1" means that the threshold voltage (level) of the negative electrode cell MC2 is changed to a threshold voltage higher than the threshold voltage changed by the usual writing control of the data "1". As the result of performing the strong writing control of the data "1", the threshold voltage Vth of the negative electrode cell MC2 is higher than the threshold voltage Vth of the positive electrode cell MC1.

Next, the sequencer 3 performs the initialization control. As the result of performing the initialization control, affected by a difference of the threshold voltage Vth between the both memory cells before the initialization, the threshold voltage Vth of the negative electrode cell MC2 is higher than the threshold voltage Vth of the positive electrode cell MC1.

Next, the case of initializing the complementary cell CC of the data "1" will be described.

Figure 16:
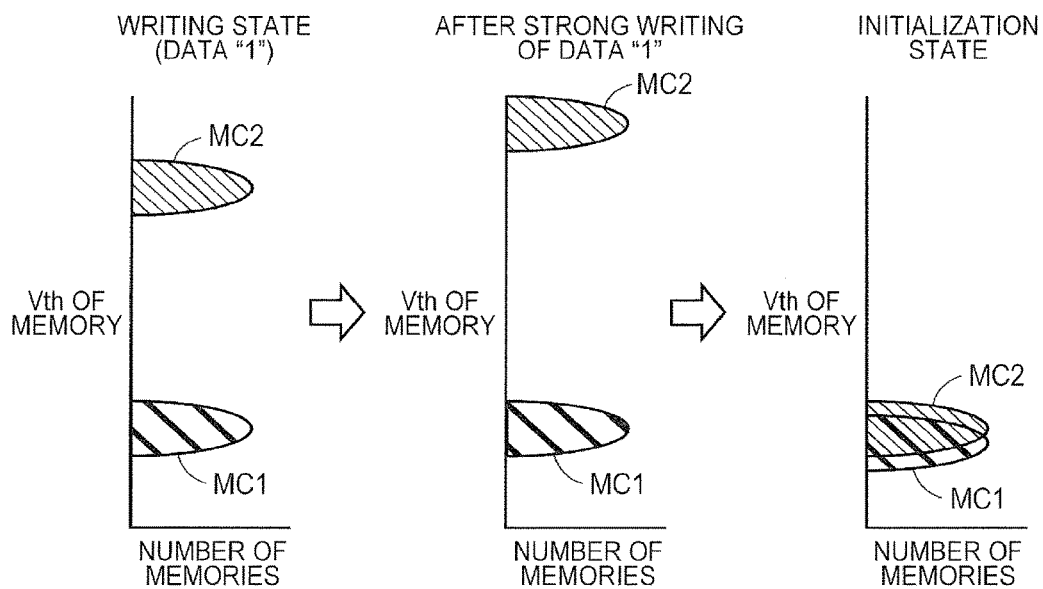
FIG. 16 is a view showing a transition of the threshold voltage distribution in the both memory cells forming the complementary cell (data "1") in the case of initialization by the initialization method according to the second embodiment.

FIG. 16 is a view showing a transition of a threshold voltage distribution in the both memory cells forming the complementary cell in the case of initialization by the initialization method according to the second embodiment.

With reference to FIG. 16, the sequencer 3 performs the strong writing control of the data "1" on the complementary cell CC from the state of the complementary cell data "1". As the result of performing the strong writing control of the data "1", the threshold voltage Vth of the negative electrode cell MC2 is further higher.

Next, the sequencer 3 performs the initialization control. As the result of performing the initialization control, affected by a difference of the threshold voltage Vth between the both memory cells before the initialization, the threshold voltage Vth of the negative electrode cell MC2 is higher than the threshold voltage Vth of the positive electrode cell MC1.

As shown in FIGS. 15 and 16, in the initialization method of the complementary cell according to the second embodiment, the data of the complementary cell CC always becomes "1" (the threshold voltage Vth of the negative electrode cell MC2 is higher than the threshold voltage Vth of the positive electrode cell MC1) even in the case of initialization from any state of the data "0" and "1" in the complementary cell CC. Therefore, in the case of performing the initialization method according to the second embodiment, it is difficult to determine whether the data of the complementary cell CC written before the initialization is "0" or "1".

Further, compared to the initialization method of the complementary cell according to the first embodiment, the initialization method according to the second embodiment has less control steps. According to the initialization method according to the second embodiment, it is possible to realize the initialization of the complementary cell with a higher security at a higher speed.

In another aspect of the second embodiment, it may be considered that the sequencer 3 performs the strong writing control of the data "0" not the strong writing control of the data "1" on the complementary cell CC before performing the initialization control.

In FIGS. 15 and 16, the sequencer 3 performs the strong writing control of the data "0" on the complementary cell CC, instead of the strong writing control of the data "1". As the result of performing the strong writing control of the data "0", the threshold voltage Vth of the positive electrode cell MC1 is higher than the threshold voltage Vth of the negative electrode cell MC2. Therefore, even in the case of initialization from any state of the data "0" and "1" in the complementary cell CC, affected by a difference of the threshold voltage Vth between the both memory cells before the initialization control, the threshold voltage Vth of the positive electrode cell MC1 is higher than the threshold voltage Vth of the negative electrode cell MC2. In the initialization from any state of the data "0" and "1" in the complementary cell CC, the data of the complementary cell CC becomes "0" (the state in which the threshold voltage Vth of the positive electrode cell MC1 is higher than the threshold voltage Vth of the negative electrode cell MC2). As the result, the initialization method based on the second embodiment cannot determine whether the data of the complementary cell CC before the initialization is "0" or "1".

Figure 17:
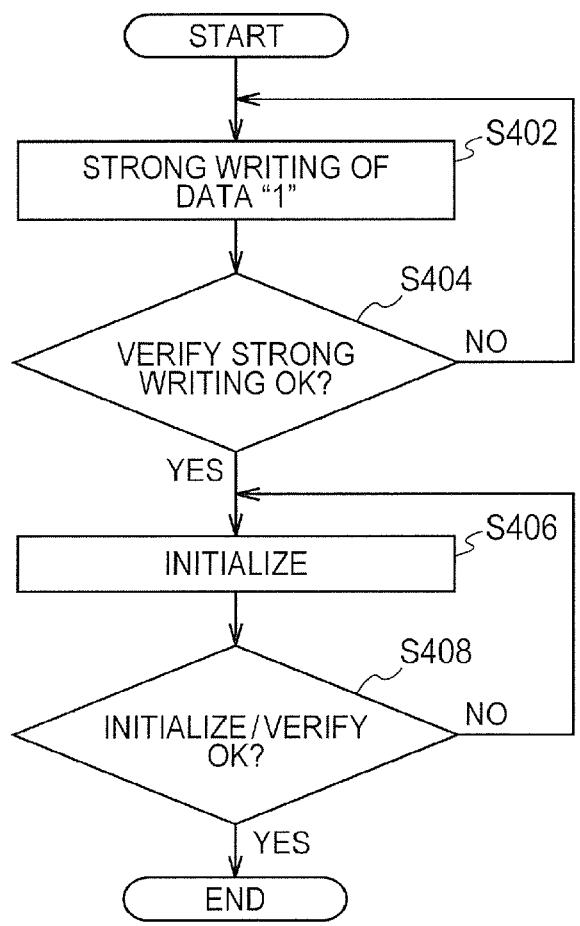
FIG. 17 is a view showing an initialization flow in the complementary cell according to the second embodiment.
Figure 18:
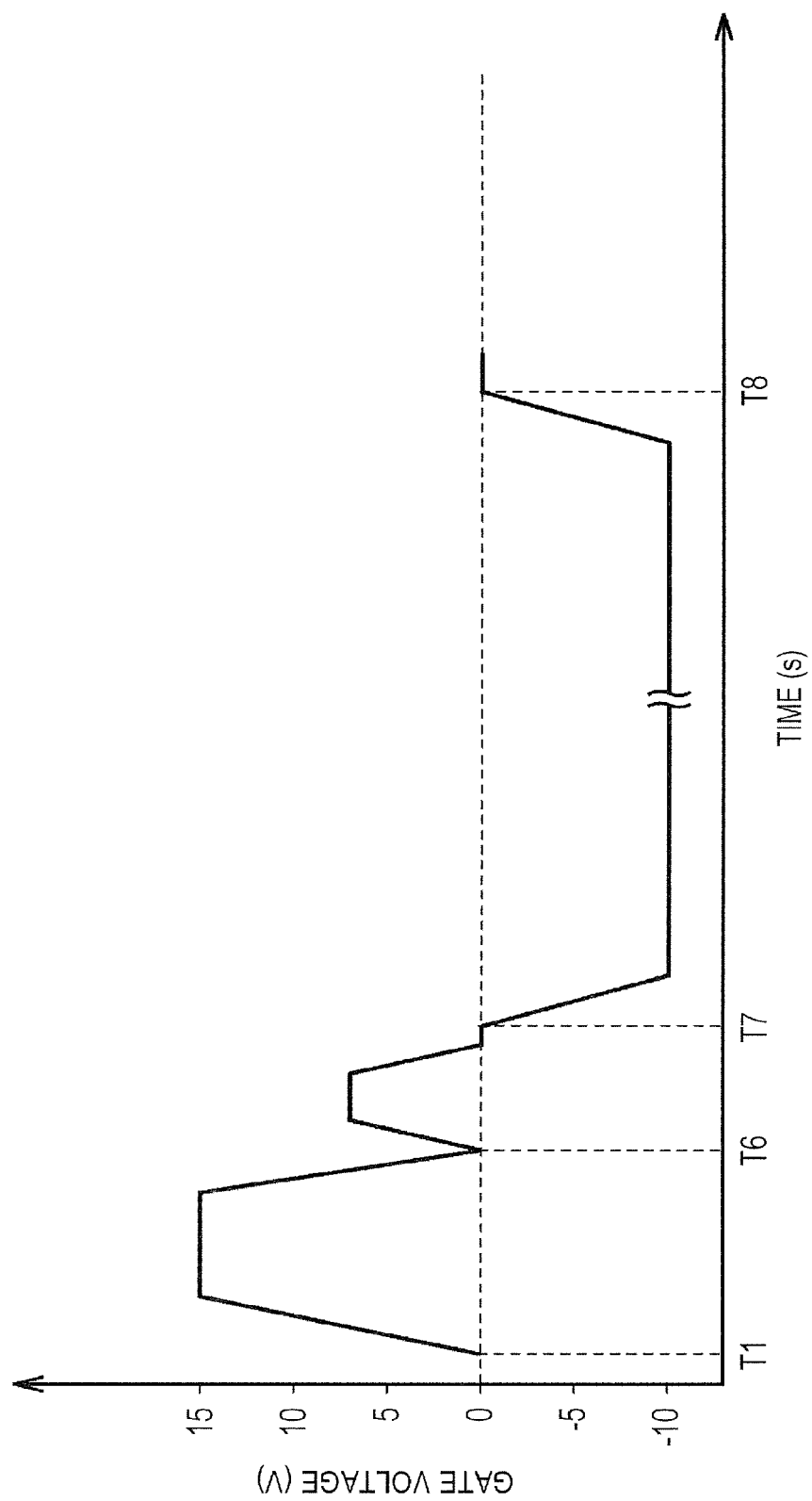
FIG. 18 is a view for use in describing a timing chart of a voltage to be applied to a memory gate corresponding to the initialization flow of FIG. 17.

FIG. 17 is a view showing an initialization flow of the complementary cell according to the second embodiment. FIG. 18 is a view for use in describing a timing chart of a voltage to be applied to the memory gate corresponding to the initialization flow of FIG. 17. With reference to FIG. 17, the sequencer 3 performs the strong writing control of the data "1" on the complementary cell CC (Step S402). Specifically, at the time T1 shown in FIG. 18, the power control circuit 210 applies the voltage of BL=0 V, CG=1.5 V, MG=15 V, SL=6 V, and WELL=0 V to the negative electrode cell MC2 specified by address for 5 μs. As the result of the application of the targeted voltage, the threshold voltage Vth of the negative electrode cell MC2 becomes 7 V.

Then, the sequencer 3 confirms whether or not the specified memory cells MC1 and MC2 arrive at the targeted threshold voltage Vth or not (Step S404). Specifically, at the time T6 shown in FIG. 18, the power control circuit 210 applies the voltage of BL=1.5 V, CG=1.5 V, MG=7 V, SL=0 V, and WELL=0 V to the memory cells MC1 and MC2 for 1 μs.

The verify circuits VSA1 and VSA2 compare the cell data output from the specified memory cells MC1 and MC2 with the data held by the corresponding data latch circuits DL1 and DL2. Based on the comparison result output from the verify circuits VSA1 and VSA2, when the sequencer 3 determines that the both data is in one accord (YES in Step S404), it proceeds to the next initialization step (Step S406). On the other hand, when the sequencer 3 determines that the both data is not in one accord (NO in Step S404), it outputs the instruction of performing the strong writing control of the data "1" on the complementary cell CC to the memory module 2 again.

The sequencer 3 turns the threshold voltage Vth of the memory cells MC1 and MC2 specified by address into the low threshold voltage state (Step S406). Specifically, at the time T7 shown in FIG. 18, the power control circuit 210 applies the voltage of BL=Hi-Z (high impedance state), CG=1.5 V, MG=−10 V, SL=6 V, and WELL=0 V to the memory cells MC1 and MC2 for 50 µs.

The sequencer 3 confirms whether or not the memory cells MC1 and MC2 specified by address arrive at the targeted low threshold voltage state (Step S408). Specifically, at the time T8 shown in FIG. 18, the power control circuit 210 applies the voltage of BL=1.5 V, CG=1.5 V, MG=0 V, SL=0 V, and WELL=0 V to the memory cells MC1 and MC2 for 1 µs.

The verify circuits VSA1 and VSA2 compare the cell data output from the specified memory cells MC1 and MC2 with the data held by the corresponding data latch circuits DL1 and DL2.

Based on the comparison result output from the verify circuits VSA1 and VSA2, when the sequencer 3 determines that the both data is in one accord (YES in Step S408), it finishes a series of the initialization control. On the other hand, when the sequencer 3 determines that the both data is not in one accord (NO in Step S408), it returns the control to Step S406, where it outputs the instruction of performing the initialization control on the complementary cell CC to the memory module 2 again.

In FIGS. 17 and 18, the voltage value and the application time in each step are only one example and not restricted to these.

The initialization method of the complementary cell according to the second embodiment can initialize the data stored in the complementary cell at a higher speed and completely, in the structure using the complementary cell as a storing element of a semiconductor device.

Third Embodiment—Initialization of Complementary Cell with Pre-Write

In an initialization method of a complementary cell according to a third embodiment, the sequencer 3 performs a pre-write control, in addition to the initialization method performed in the first and second embodiments. The pre-write control indicates a control of performing the writing control of the data "0" and the writing control of the data "1" on the complementary cell CC.

In the initialization method according to the first embodiment, in FIG. 12, after the writing control of the data "1", the positive electrode cell MC1 is in the low threshold voltage state. Next, when the sequencer 3 performs the initialization control, the positive electrode cell MC1 is further reduced in the threshold voltage Vth from the low threshold voltage state. By a control of reducing the threshold voltage further from the low threshold voltage state, load is imposed on the positive electrode cell MC1, to shorten the lifetime of the complementary cell.

Figure 19:
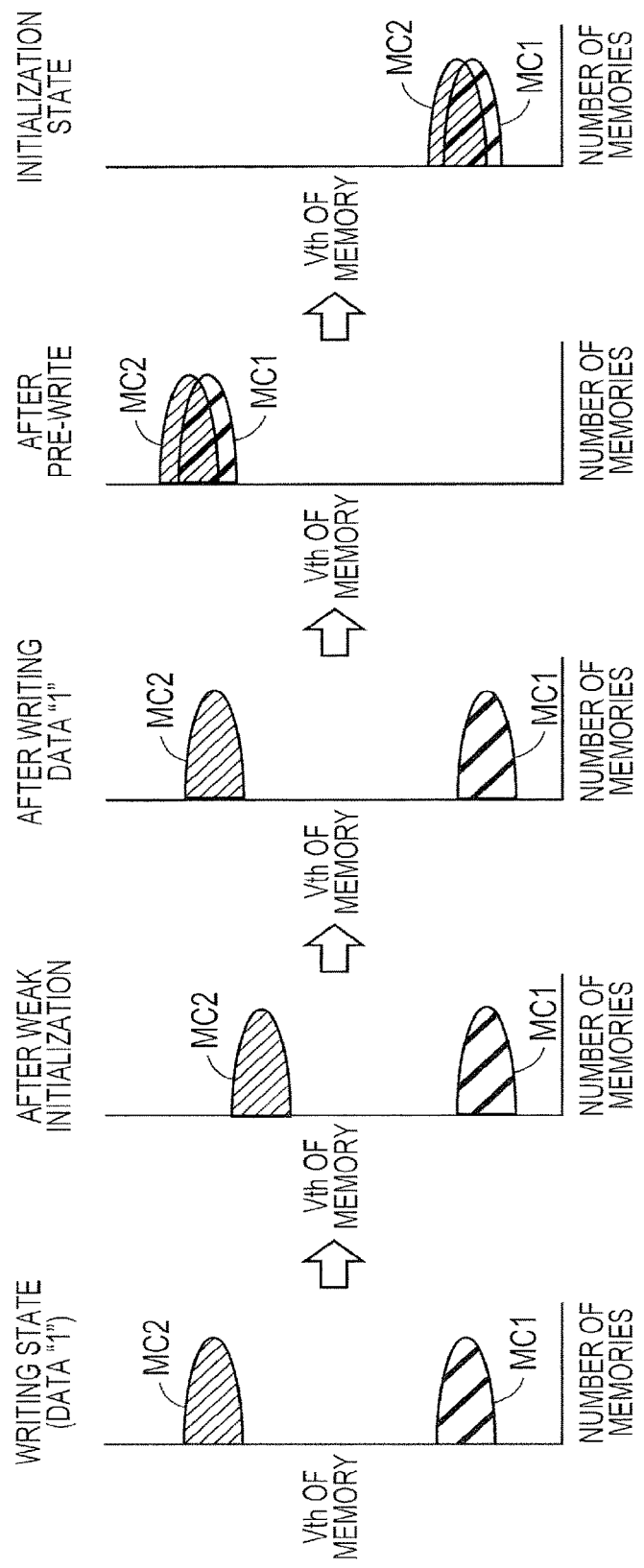
FIG. 19 is a view showing a transition of the threshold voltage distribution in the both memory cells forming the complementary cell (data "1") in the case of initialization by an initialization method according to a third embodiment.

FIG. 19 is a view showing a transition of the threshold voltage distribution in the both memory cells forming the complementary cell (data "1") in the case of initialization by the initialization method according to the third embodiment. In the initialization method shown in FIG. 19, the sequencer 3 performs a pre-write control in addition to the control shown in FIG. 12. A pre-write control may be performed at any time before performing the initialization control from the writing state. In the example shown in FIG. 19, the sequencer 3 performs the pre-write control just before the initialization control. In FIGS. 19 and 12, it is the same from the writing state to the state after writing the data "1"; therefore, a description about the same portions is not repeated.

With reference to FIG. 19, when the sequencer 3 performs the writing control of the data "1" on the complementary cell CC, the positive electrode cell MC1 is in the low threshold voltage state and the negative electrode cell MC2 is in the high threshold voltage state. Next, when the sequencer 3 performs the pre-write control, the threshold voltage Vth of the positive electrode cell MC1 is in the high threshold voltage state and the threshold voltage Vth of the negative electrode cell MC2 is higher. As the result of performing the pre-write control, affected by a difference of the threshold voltage Vth between the both memory cells before the pre-write control, the threshold voltage Vth of the negative electrode cell MC2 is higher than the threshold voltage Vth of the positive electrode cell MC1. Next, the sequencer 3 performs the initialization control. As the result of performing the initialization control, affected by a difference of the threshold voltage Vth in the both memory cells before the initialization, the threshold voltage Vth of the negative electrode cell MC2 is higher than the threshold voltage Vth of the positive electrode cell MC1.

By the pre-write control performed by the sequencer 3, both the memory cells MC1 and MC2 are in the high threshold voltage state just before the initialization control. Therefore, it is possible to reduce the load imposed on the memory cells MC1 and MC2 caused by the initialization control as much as possible. In the case of performing the initialization method according to the third embodiment, the load imposed on the memory cell can be reduced, hence to realize life extension of the complementary cell.

In FIG. 19, although the initialization with the pre-write control added is performed on the complementary cell CC having the data "1" written, the similar initialization with the pre-write control added is performed also on the complementary cell CC having the data "0" written.

Figure 20:
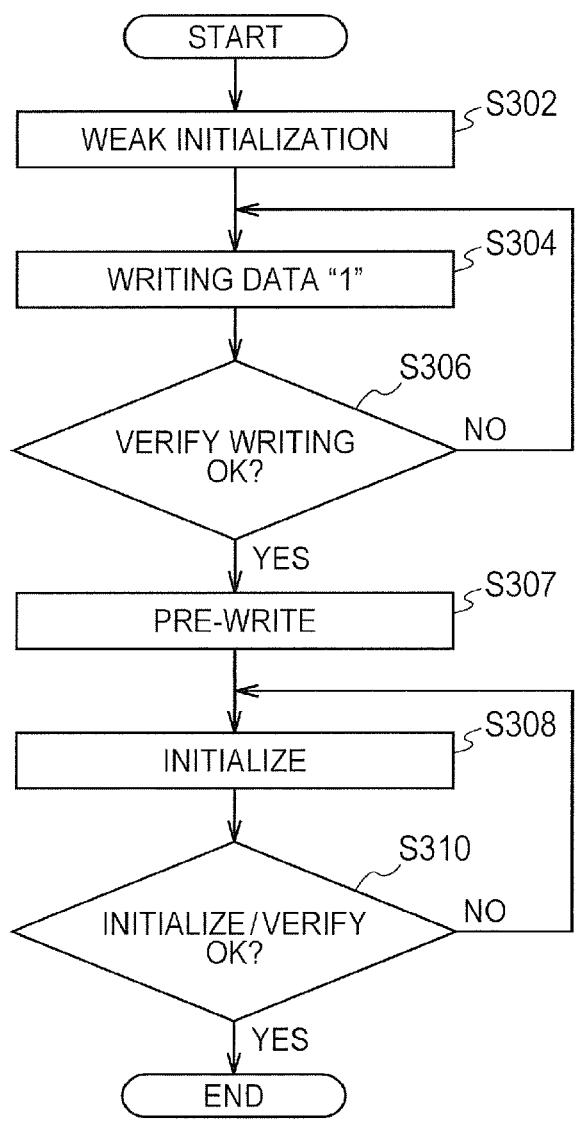
FIG. 20 is a view showing an initialization flow in the complementary cell according to the third embodiment.

FIG. 20 is a view showing an initialization flow of the complementary cell according to the third embodiment.

Figure 21:
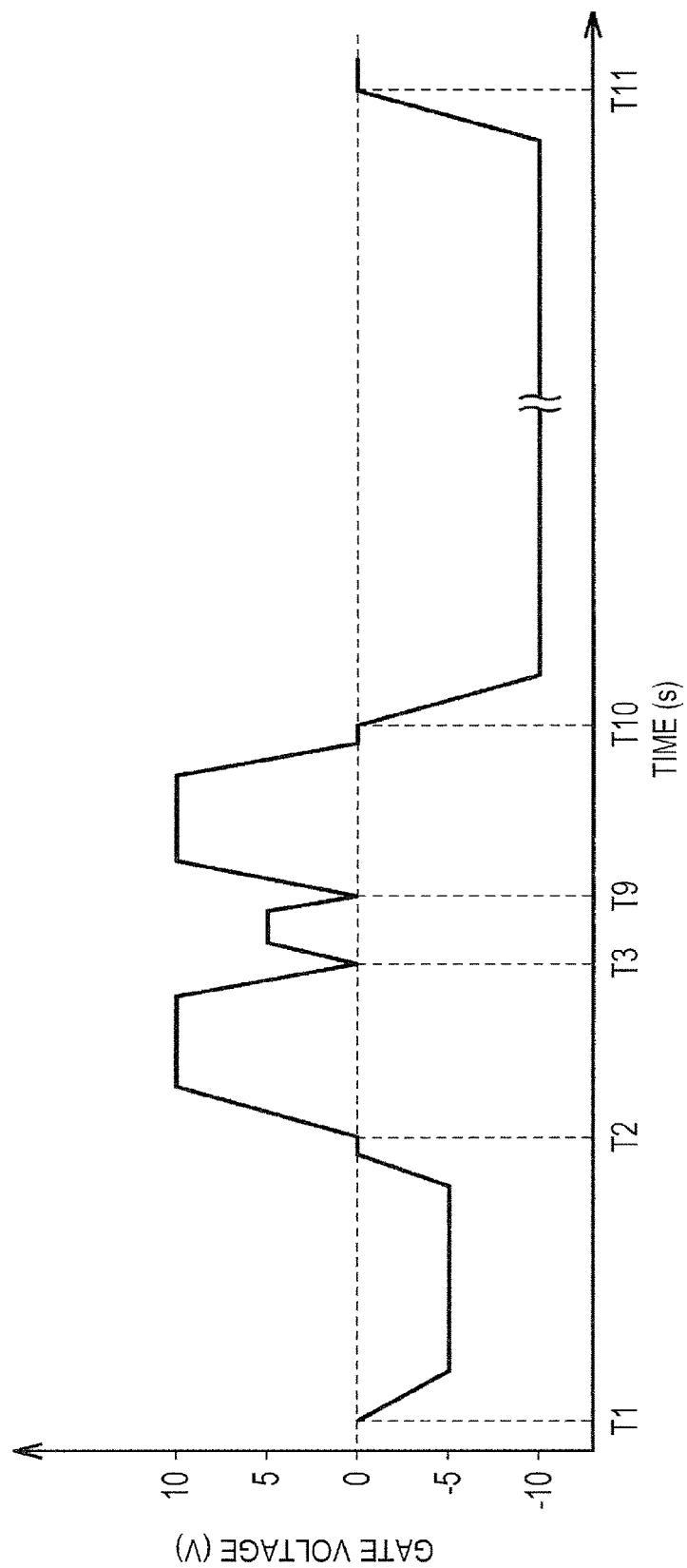
FIG. 21 is a view for use in describing a timing chart of a voltage to be applied to a memory gate corresponding to the initialization flow of FIG. 20.

FIG. 21 is a view for use in describing a timing chart of a voltage to be applied to a memory gate corresponding to the initialization flow of FIG. 20. In FIGS. 20 and 13 and in FIGS. 21 and 14, every control other than the pre-write control is the same. Accordingly, a description about the same portions is not repeated.

After determining that the specified memory cells MC1 and MC2 arrive at the targeted threshold voltage Vth (YES in Step S306), the sequencer 3 performs the pre-write control (Step S307). Specifically, at the tie T9 shown in FIG. 21, the power control circuit 210 applies the voltage of BL=0 V, CG=1.5 V, MG=10 V, SL=6 V, and WELL=0 V to the memory cells MC1 and MC2 specified by address for 5 µs.

In FIGS. 20 and 21, the voltage value and the application time in each step are only one example and not restricted to these.

The initialization method according to the third embodiment can initialize the data stored in the complementary cell completely while suppressing the load imposed on the complementary cell, in the structure using the complementary cell as a storing element of a semiconductor device.

Also the initialization method according to the second embodiment can suppress the load imposed on the complementary cell by performing the pre-write control. In the initialization method according to the second embodiment, in FIG. 16, the positive electrode cell MC1 is in the low threshold voltage state just before the initialization control. Therefore, by the control of reducing the threshold voltage further from the low threshold voltage state, the positive electrode cell MC1 has a load and the lifetime of the complementary cell is shortened.

Figure 22:
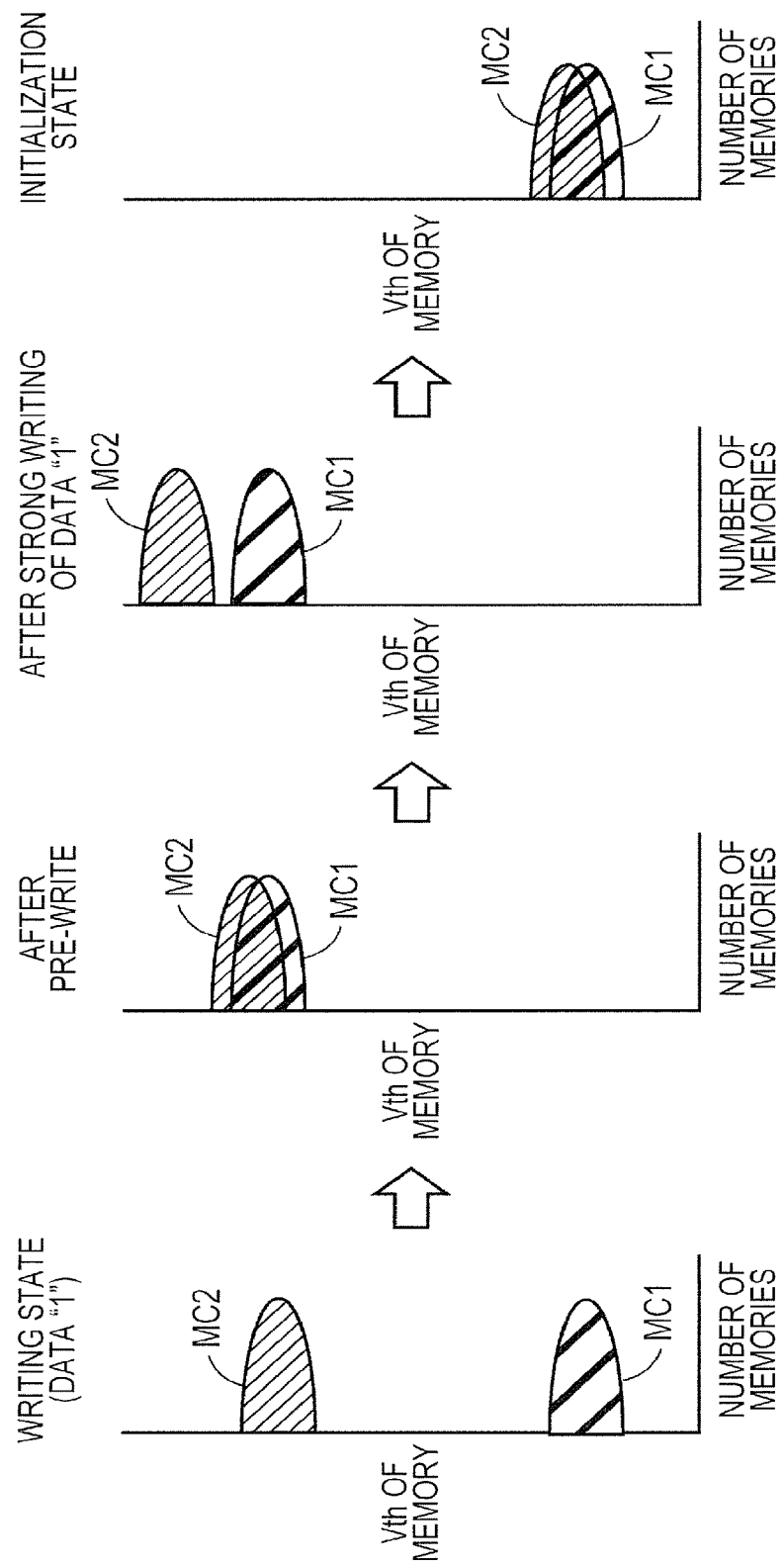
FIG. 22 is a view showing a transition of the threshold voltage distribution in the both memory cells forming the complementary cell (data "1") in the case of initialization by the initialization method according to the third embodiment.

FIG. 22 is a view of another exemplary aspect of the present invention, showing a transition of a threshold voltage distribution in the both memory cells forming the complementary cell (data "1") in the case of initialization by the initialization method according to the third embodiment. In the initialization method shown in FIG. 22, the sequencer 3 performs the pre-write control, in addition to the control shown in FIG. 16. The pre-write control may be performed at any time before performing the initialization control from the writing state. In the example shown in FIG. 22, the sequencer 3 performs the pre-write control before performing the strong writing control of the data "1" on the complementary cell CC.

With reference to FIG. 22, at first, the sequencer 3 performs the pre-write control from the state of the complementary cell CC data "1". As the result of performing the pre-write control, the positive electrode cell MC1 is in the high threshold voltage state and the threshold voltage Vth of the negative electrode cell MC2 is higher.

Next, the sequencer 3 performs the strong writing control of the data "1" on the complementary cell CC. As the result of performing the strong writing control of the data "1", the threshold voltage Vth of the negative electrode cell MC2 is further higher. Next, when the sequencer 3 performs the initialization control, affected by a difference of the threshold voltage Vth between the both memory cells before the initialization control, the threshold voltage Vth of the negative electrode cell MC2 is higher than the threshold voltage Vth of the positive electrode cell MC1.

Also in the initialization method according to the second embodiment, by the pre-write control performed by the sequencer 3, the memory cells MC1 and MC2 are both in the high threshold voltage state just before the initialization control. Accordingly, in the case of performing the initialization method based on the third embodiment, it is possible to reduce the load imposed on the memory cell caused by the initialization control, hence to realize a life extension of the complementary cell.

In FIG. 22, although the initialization with the pre-write control added is performed on the complementary cell CC having the data "1" written, the similar initialization with the pre-write control added is performed also on the complementary cell CC having the data "0" written.

Even when the data written in the complementary cell is "0" in the first embodiment and the second embodiment, the initialization of the complementary cell by adding the pre-write control can be performed.

Fourth Embodiment—Switching Between High Speed Initialization Mode and High Security Initialization Mode Compared with the conventional initialization method of the complementary cell, the initialization method according to the first to the third embodiments can perform the initialization completely but takes longer time for the initialization processing. Of the users of the complementary cell, there is someone who wants high speedy processing rather than a high security.

Figure 23:
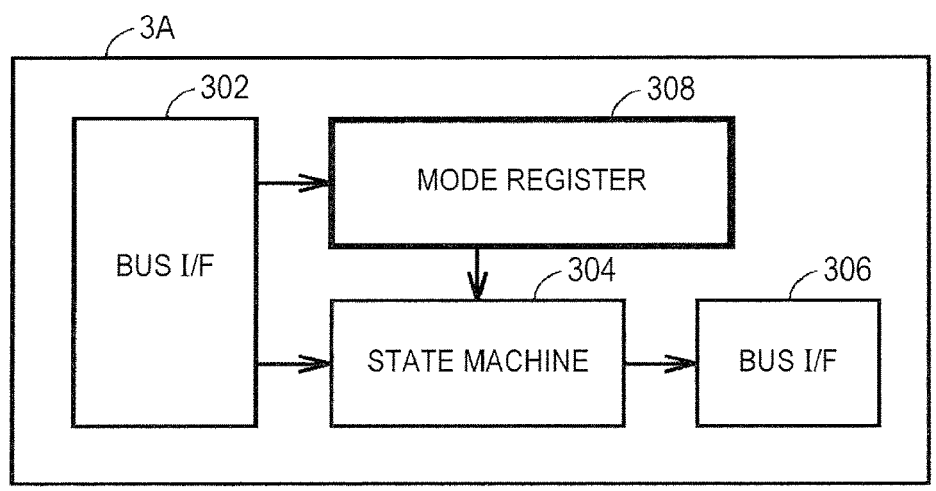
FIG. 23 is a block diagram showing a sequencer according to a fourth embodiment.

FIG. 23 is a block diagram showing a sequencer according to a fourth embodiment. The sequencer 3A includes a mode register 308 in addition to the bus interfaces 302 and 306 and the state machine 304. The sequencer 3A inputs a command from the CPU 5 to the bus interface 302 through the peripheral bus PBUS. The bus interface 302 outputs the input command to the mode register 308 and the state machine 304. The mode register 308 determines whether the command from the CPU 5 is the high speed initialization mode of the conventional initialization method or the high security mode of the initialization method according to one of the first to the third embodiments. The mode register 308 outputs the determination result to the state machine 304. The conventional initialization method is the initialization method shown in FIG. 8.

The user of the complementary cell can select the high speed initialization mode or the high security mode. The micro-computer 1 receives an input of the selection result of the user from the port 4 or the port 7. The port 4 or the port 7 outputs the selection result of the user to the CPU 5 through the bus interface 6. The CPU 5 outputs the selection result of the user to the sequencer 3A through the peripheral bus PBUS.

Based on the command input from the bus interface 302 and the determination result input from the mode register 308, the state machine 304 outputs the control command corresponding to the high speed initialization mode or the high security mode to the bus interface 306. The memory module 2 applies a predetermined voltage to the memory cells MC1 and MC2 according to the instruction from the sequencer 3A.

A user of the complementary cell who gives preference to the security over the processing speed can select the high security mode according to one of the first to the third embodiments. On the other hand, a user of the complementary cell who gives preference to the processing speed over the security can select the high speed initialization mode of the conventional initialization method. Accordingly, the initialization method according to the fourth embodiment can provide an initialization method of the complementary cell according to a user's need.

Figure 24:
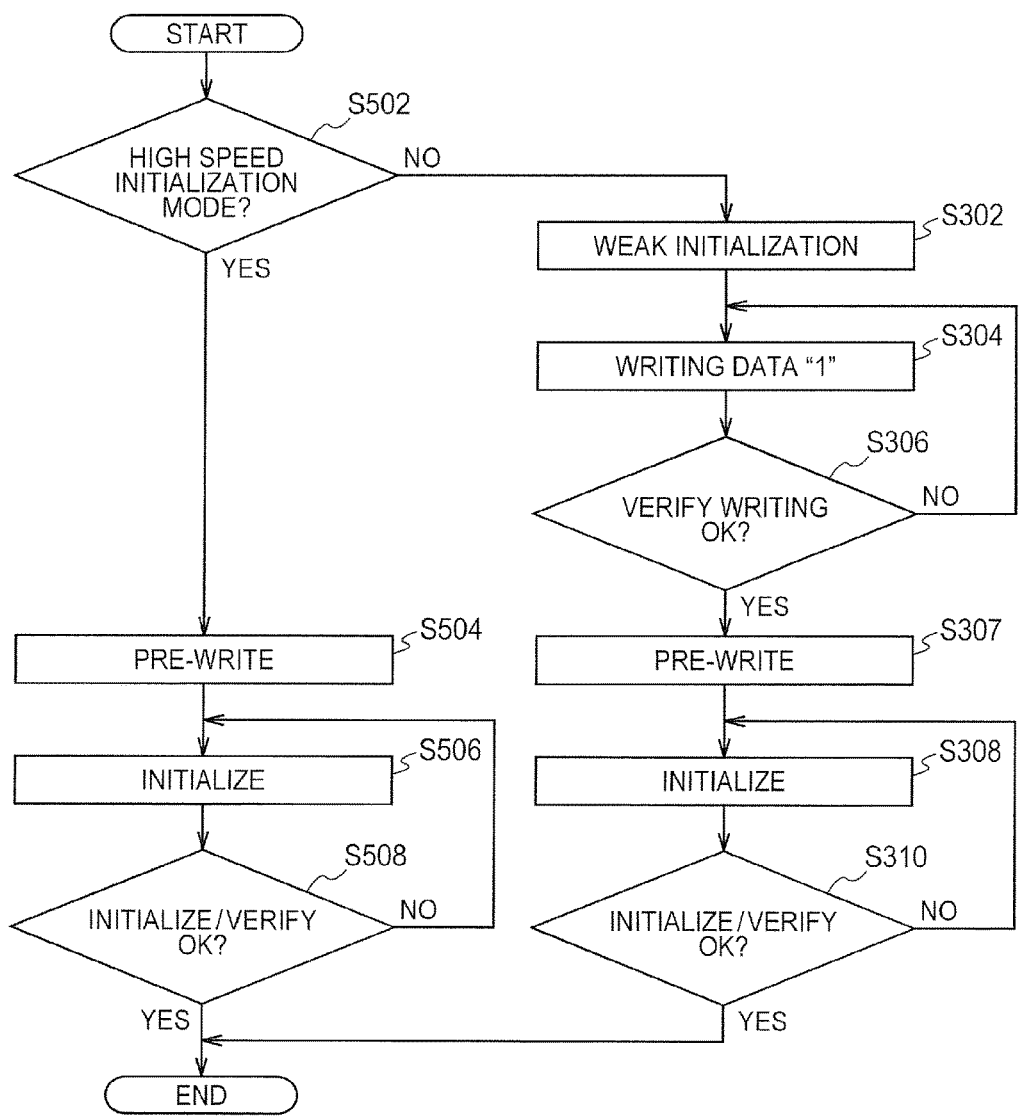
FIG. 24 is a view showing a data initialization flow in the complementary cell according to the fourth embodiment.

FIG. 24 is a view showing a data initialization flow of the complementary cell according to the fourth embodiment. With reference to FIG. 24, the mode register 308 determines whether or not the initialization method of the complementary cell CC is a high speed initialization mode (Step S502).

In the mode register 308, when the initialization method of the complementary cell CC is determined to be the high speed initialization mode (YES in Step S502), the sequencer 3A performs the pre-write control on the memory cells MC1 and MC2 specified by address (Step S504). As the result of performing the pre-write control, the threshold voltage Vth of the both memory cells is higher.

Next, the sequencer 3A performs the initialization control on the memory cells MC1 and MC2 specified by address (Step S506). As the result of performing the initialization control, the threshold voltage Vth of the both memory cells is in the low threshold voltage state.

Then, the sequencer 3A determines whether or not the specified memory cells MC1 and MC2 arrive at the targeted low threshold voltage state or not (Step S508). Specifically, the verify circuits VSA1 and VSA2 compare the cell data of the memory cells MC1 and MC2 specified by address with the data held by the corresponding data latch circuits DL1 and DL2. Based on the comparison result of the verify circuits VSA1 and VSA2, when the sequencer 3A determines that the both data is in one accord (YES in Step S508), it finishes the writing control. On the other hand, when the sequencer 3A determines that the both data is not in one accord (NO in Step S508), it outputs the instruction of performing the initialization control to the memory module 2 again.

In the mode register 308, a control when the initialization method of the complementary cell CC is determined not to be the high speed initialization mode (NO in Step S502) is the same as the initialization control flow shown in FIG. 20. Therefore, their detail is not repeated. In the embodiment, although the pre-write processing is performed in the high speed initialization mode (YES in Step S502) and the high security mode (NO in Step S502), this processing can be omitted.

According to the initialization method of the complementary cell in the fourth embodiment, it is possible to provide an initialization method of the complementary cell in accordance with a user's need, even when using the complementary cell as a storing element of a semiconductor device.

As set forth hereinabove, the invention made by the inventor et al. has been described specifically based on the embodiments, the invention is not restricted to the above embodiments but, needless to say, various modifications are possible in the range without departing from the spirit.

What is claimed is:

1. A controlling method of a semiconductor device provided with a memory array including a plurality of complementary memory cells, each cell including a first memory element and a second memory element, for holding a binary datum depending on a difference of threshold voltage between the first memory element and the second memory element, the controlling method comprising:
performing a prewrite procedure on each of the plurality of complementary memory cells that results in the first memory element being in a high threshold voltage distribution and the second memory element being in a high threshold voltage distribution, wherein the threshold voltage distribution of one of the first and second memory elements is higher than that of another of the first and second memory elements; and
performing a strong writing of data "1" on each of the plurality of complementary memory cells resulting in shifting the higher threshold voltage distribution among the threshold voltage distributions of the first and second memory elements resulting from the prewrite procedure further to be higher than the higher threshold voltage distribution of the first and second memory elements when the complementary memory cell stores a data "1" via a writing control of data "1".

2. The method according to claim 1, wherein the prewrite procedure is performed before an initialization procedure of the first memory element and the second memory element.

3. The method according to claim 1, wherein the prewrite procedure is performed between a data written state to both of the first memory element and the second memory element and an initialization procedure of both of the first and second memory elements.

4. The method according to claim 1, wherein the prewrite procedure is performed before the threshold voltage distribution of the second memory element is changed to the threshold voltage distribution higher than the threshold voltage distribution changed by the writing control of the data "1".

5. The method according to claim 1, wherein, when the prewrite procedure is performed, the threshold voltage distribution of the second memory elements is higher than that of the first memory elements.

6. The method according to claim 5, wherein the first memory element comprises a positive electrode cell and the second memory element comprises a negative electrode cell.

7. The method according to claim 2, wherein both of the first and second memory elements are in a high voltage threshold state at a time of beginning the initialization procedure.

8. A semiconductor device, comprising:
a memory array including a plurality of complementary memory cells, each cell including a first memory element and a second memory element, for holding a binary datum depending on a difference of threshold voltage between the first memory element and the second memory element; and
a control circuit for initializing the complementary cells, wherein the control circuit performs a prewrite procedure on each of the plurality of complementary memory cells that results in the first memory element being in a high threshold voltage distribution and the second memory element being in a high threshold distribution, wherein the threshold voltage distribution of one of the first and second memory elements is higher than that of another of the first and second memory elements, and
wherein the control circuit further performs a strong writing of data "1" on each of the plurality of complementary memory cells resulting in shifting the higher threshold voltage distribution among the threshold voltage distributions of the first and second memory elements resulting from the prewrite procedure further to be higher than the higher threshold voltage distribution of the first and second memory elements when the complementary memory cell stores the data "1" via a writing control of the data "1".

9. The semiconductor device according to claim 8, wherein the control circuit performs the prewrite procedure before the initializing of the first memory element and the second memory element.

10. The semiconductor device according to claim 8, wherein the control circuit performs the prewrite procedure between a data written state to both of the first memory element and the second memory element and the initializing of said both of the first memory element and the second memory element.

11. The semiconductor device according to claim 8, wherein the control circuit performs the prewrite procedure before the threshold voltage distribution of the second memory element is changed to the threshold voltage distribution higher than the threshold voltage distribution changed by the writing control of the data "1".

12. The semiconductor device according to claim 8, wherein, when the control circuit performs the prewrite procedure, the threshold voltage distribution of the second memory elements is higher than that of the first memory elements.

13. The semiconductor device according to claim 12, wherein the first memory element comprises a positive electrode cell and the second memory element comprises a negative electrode cell.

14. The semiconductor device according to claim 8, wherein both of the first and second memory elements are in a high voltage threshold state at a time of beginning the initializing.

15. A non-transitory computer-readable recording medium for storing a program executable by a computer, the program including executable instruction for performing a controlling method of a semiconductor device provided with a memory array including a plurality of complementary memory cells, each cell including a first memory element and a second memory element, for holding a binary datum depending on a difference of threshold voltage between the first memory element and the second memory element, the program when executed by the computer performing:

performing a prewrite procedure on each of the plurality of complementary memory cells that results in the first memory element being in a high threshold voltage distribution and the second memory element being in a high threshold voltage distribution, wherein the threshold voltage distribution of one of the first and second memory elements is higher than that of another of the first and second memory elements; and performing a strong writing of data "1" on each of the plurality of complementary memory cells resulting in shifting the higher threshold voltage distribution among the threshold voltage distributions of the first and second memory elements resulting from the prewrite procedure further to be higher than the higher threshold voltage distribution of the first and second memory elements when the complementary memory cell stores the data "1" via a writing control of the data "1".

16. The non-transitory computer-readable recording medium according to claim 15, wherein the prewrite procedure is performed before an initialization procedure of the first memory element and the second memory element.

17. The non-transitory computer-readable recording medium according to claim 15, wherein the prewrite procedure is performed between a data written state to both of the first memory element and the second memory element and an initialization procedure of said both of the first and second memory elements.

18. The non-transitory computer-readable recording medium according to claim 15, wherein the prewrite procedure is performed before the threshold voltage distribution of the second memory element is changed to the threshold voltage distribution higher than the threshold voltage distribution changed by the writing control of the data "1".

19. The non-transitory computer-readable recording medium according to claim 15, wherein, when the prewrite procedure is performed, the threshold voltage distribution of the second memory element is higher than that of the first memory element.

20. The non-transitory computer-readable recording medium according to claim 16, wherein both of the first and second memory elements are in a high voltage threshold state at a time of beginning the initialization procedure.

* * * * *